United States Patent
Igarashi et al.

(10) Patent No.: US 12,557,208 B2
(45) Date of Patent: Feb. 17, 2026

(54) HIGH FREQUENCY CIRCUIT

(71) Applicant: SUMITOMO ELECTRIC INDUSTRIES, LTD., Osaka (JP)

(72) Inventors: Shun Igarashi, Osaka (JP); Hiroshi Ueda, Osaka (JP); Suguru Yamagishi, Osaka (JP); Ichiro Kuwayama, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 383 days.

(21) Appl. No.: 18/278,928

(22) PCT Filed: Dec. 27, 2021

(86) PCT No.: PCT/JP2021/048525
§ 371 (c)(1),
(2) Date: Aug. 25, 2023

(87) PCT Pub. No.: WO2022/185695
PCT Pub. Date: Sep. 9, 2022

(65) Prior Publication Data
US 2024/0138055 A1    Apr. 25, 2024
US 2024/0237192 A9    Jul. 11, 2024

(30) Foreign Application Priority Data

Mar. 3, 2021 (JP) ................. 2021-033122

(51) Int. Cl.
*H01P 3/08*    (2006.01)
*H01P 3/02*    (2006.01)
(Continued)

(52) U.S. Cl.
CPC ............. *H05K 1/0222* (2013.01); *H01P 3/08* (2013.01); *H05K 1/113* (2013.01)

(58) Field of Classification Search
CPC .......................... H05K 1/0219; H05K 1/0222
See application file for complete search history.

(56) References Cited

U.S. PATENT DOCUMENTS

| 5,770,981 A | 6/1998 | Koizumi et al. |
| 5,946,794 A | 9/1999 | Koizumi et al. |

(Continued)

FOREIGN PATENT DOCUMENTS

| CN | 107969065 A | 4/2018 |
| JP | 06037416 A  | 2/1994 |

(Continued)

*Primary Examiner* — Timothy J Thompson
*Assistant Examiner* — Amol H Patel
(74) *Attorney, Agent, or Firm* — Renner, Otto, Boisselle & Sklar, LLP

(57) ABSTRACT

A high frequency circuit includes a first insulating layer; a second insulating layer stacked on the first insulating layer directly or with one or more intermediate layers interposed therebetween; a first ground disposed on a first surface that does not face the second insulating layer among the first surface and a second surface forming two surfaces of the first insulating layer; a first line having a first end portion to which a first alternating-current signal is to be supplied and a second line having a second end portion to which a second alternating-current signal is to be supplied that are disposed between the first insulating layer and the second insulating layer; a second ground disposed on a third surface that does not face the first insulating layer among the third surface and a fourth surface forming two surfaces of the second insulating layer; and a first shield via.

20 Claims, 22 Drawing Sheets

(51) Int. Cl.
  *H01P 5/08*   (2006.01)
  *H05K 1/02*   (2006.01)
  *H05K 1/11*   (2006.01)

(56) References Cited

U.S. PATENT DOCUMENTS

| | | | |
|---|---|---|---|
| 9,159,625 | B1 | 10/2015 | Lee et al. |
| 2016/0150633 | A1* | 5/2016 | Cartier, Jr. ............ H05K 1/0298 |
| | | | 29/842 |
| 2016/0374199 | A1 | 12/2016 | Kondo |
| 2017/0303395 | A1 | 10/2017 | Ishida et al. |
| 2018/0124917 | A1 | 5/2018 | Ajoian |
| 2021/0242602 | A1 | 8/2021 | Nishida |
| 2022/0192014 | A1* | 6/2022 | Kang .................... H05K 1/0218 |
| 2024/0276634 | A1* | 8/2024 | Li .......................... H05K 1/115 |

FOREIGN PATENT DOCUMENTS

| | | | |
|---|---|---|---|
| JP | H08-274513 | A | 10/1996 |
| JP | 2004014800 | A | 1/2004 |
| JP | 2012129350 | A | 7/2012 |
| JP | 2017011046 | A | 1/2017 |
| JP | 2018-200982 | A | 12/2018 |
| JP | 2019-029609 | A | 2/2019 |
| WO | 201647492 | A1 | 3/2016 |
| WO | 202090672 | A1 | 5/2020 |

\* cited by examiner

HIGH FREQUENCY CIRCUIT

TECHNICAL FIELD

The present disclosure relates to a high frequency circuit. The present application claims the priority based on Japanese Patent Application No. 2021-033122 filed on Mar. 3, 2021, the entire contents of which are incorporated herein by reference.

BACKGROUND ART

Patent Literature 1 discloses a structure including a large number of shield vias which are electrically connected to a front surface ground and a back surface ground of a dielectric substrate.

CITATION LIST

Patent Literature

[Patent Literature 1] Japanese Unexamined Patent Application Publication H08-274513

SUMMARY OF INVENTION

A high frequency circuit according to one aspect of the present disclosure includes a first insulating layer; a second insulating layer stacked on the first insulating layer directly or with one or more intermediate layers interposed therebetween; a first ground disposed on a first surface that does not face the second insulating layer among the first surface and a second surface forming two surfaces of the first insulating layer; a first line having a first end portion to which a first alternating-current signal is to be supplied and a second line having a second end portion to which a second alternating-current signal is to be supplied that are disposed between the first insulating layer and the second insulating layer; a second ground disposed on a third surface that does not face the first insulating layer among the third surface and a fourth surface forming two surfaces of the second insulating layer; and a first shield via that is conductive, is located between the first end portion and the second end portion that are isolated from each other in a direction along the fourth surface, extends through the first insulating layer and the second insulating layer, and is connected to the first ground and the second ground, wherein a cross section of the first shield via parallel to the second surface is inscribed in a first virtual rectangle having a long side and a short side perpendicular to the long side.

A high frequency circuit according to another aspect of the present disclosure includes a first insulating layer; a second insulating layer stacked on the first insulating layer directly or with one or more intermediate layers interposed therebetween; a first ground disposed on a first surface that does not face the second insulating layer among the first surface and a second surface forming two surfaces of the first insulating layer; a first line having a first end portion to which a first alternating-current signal is to be supplied and a second line having a second end portion to which a second alternating-current signal is to be supplied that are disposed between the first insulating layer and the second insulating layer; a second ground disposed on a third surface that does not face the first insulating layer among the third surface and a fourth surface forming two surfaces of the second insulating layer; a third ground disposed between the first insulating layer and the second insulating layer; and a first shield via that is conductive, is located between the first end portion and the second end portion that are isolated from each other in a direction along the fourth surface, extends through at least one insulating layer among the first insulating layer and the second insulating layer, and is connected to the third ground and a ground located on a side on which the at least one insulating layer is located with respect to the first end portion and the second end portion among the first ground and the second ground, wherein a cross section of the first shield via parallel to the second surface is inscribed in a first virtual rectangle having a long side and a short side perpendicular to the long side.

DETAILED DESCRIPTION

Problems to be Solved by Present Disclosure

Figure 1:
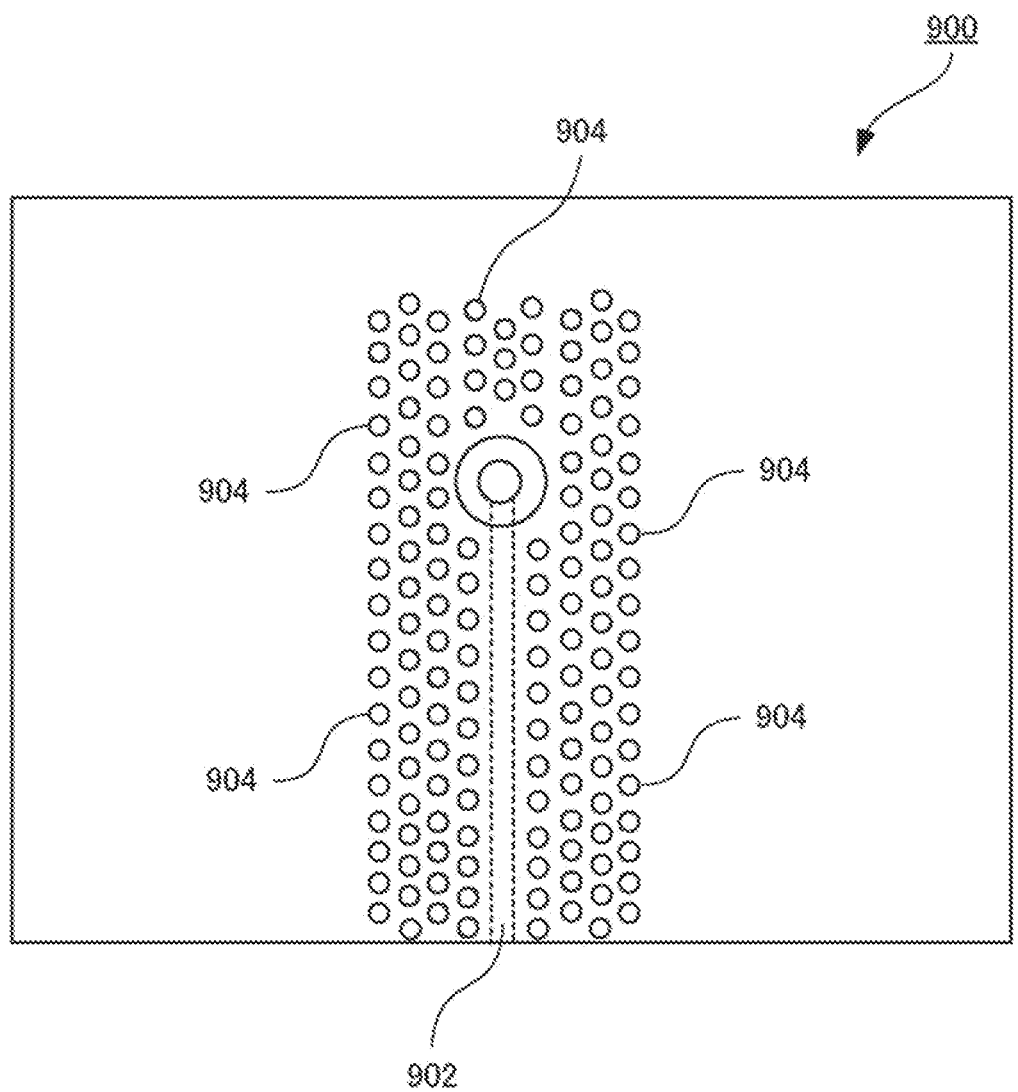
FIG. 1 is a plan view illustrating a conventional shield via.

Vertical power feeding is known as a method for supplying a signal to a pattern line formed in an inner layer of a circuit board of a flexible printed circuit (FPC). Hereinafter, a line formed in an inner layer of a circuit board is referred to as an internal line. In the vertical power feeding, for example, a structure is adopted in which a pad formed on a substrate surface and an internal line are connected to each other with a via, and a coaxial connector is brought into contact with the pad to supply a signal. When a high frequency signal is passed through adjacent line patterns, crosstalk occurs. In order to prevent this, shield through-holes or shield vias are arranged along the lines. Hereinafter, the term "shield via" is used to include a shield through-hole. Shield vias are formed by forming, in a dielectric substrate, a large number of holes each having a circular shape in plan view and extending through the dielectric substrate in a thickness direction thereof, and providing conductors made of copper or the like in each of holes. FIG. 1 illustrates an example of a structure in which a large number of shield vias 904 are formed so as to surround a signal transmission path 902 in a high frequency circuit 900 having signal transmission path 902.

When vertical power feeding is performed to a plurality of internal lines adjacent to each other, the occurrence of crosstalk due to leakage of electromagnetic waves between signal supply paths to internal lines is a particular problem. Here, the term "signal supply path" includes a pad, a connection via, and a line end portion. As a countermeasure against crosstalk, it is conceivable to arrange a large number of columnar shield vias 904 as illustrated in FIG. 1 between signal supply paths adjacent to each other. However, when an interval between the signal supply paths adjacent to each other is narrow, a large number of vias cannot be formed around a pad as illustrated in FIG. 1. For example, when a substrate is as thin as 0.3 mm in thickness, a line width is about 0.1 mm, and a line pitch is less than 1 mm, it is necessary to form a thin via in the order of φ 0.1 mm in diameter, which is difficult to manufacture. In addition, there is a problem that crosstalk between end portions adjacent to each other cannot be suppressed due to an interval portion between the shield vias only by forming columnar shield vias in a row between the end portions. In addition, there is also a problem that it is easily affected by manufacturing accuracy. In other words, when columnar shield vias are disposed between the end portions in order to suppress crosstalk, crosstalk cannot be sufficiently suppressed when positions of the shield vias are displaced.

Therefore, it is an object of the present disclosure to provide a high frequency circuit in which crosstalk due to leakage of electromagnetic waves generated in signal supply paths for supplying alternating-current signals to adjacent lines is suppressed.

Advantageous Effects of Present Disclosure

According to the present disclosure, it is possible to provide a high frequency circuit in which crosstalk due to leakage of electromagnetic waves generated in a signal supply path for supplying alternating-current signals to adjacent lines is suppressed.

Description of Embodiments of Present Disclosure

Contents of embodiments according to the present disclosure will be listed and described. At least some of the embodiments described below may be combined as desired.

(1) A high frequency circuit according to a first aspect of the present disclosure includes a first insulating layer; a second insulating layer stacked on the first insulating layer directly or with one or more intermediate layers interposed therebetween; a first ground disposed on a first surface that does not face the second insulating layer among the first surface and a second surface forming two surfaces of the first insulating layer; a first line having a first end portion to which a first alternating-current signal is to be supplied and a second line having a second end portion to which a second alternating-current signal is to be supplied that are disposed between the first insulating layer and the second insulating layer; a second ground disposed on a third surface that does not face the first insulating layer among the third surface and a fourth surface forming two surfaces of the second insulating layer; and a first shield via that is conductive, is located between the first end portion and the second end portion that are isolated from each other in a direction along the fourth surface, extends through the first insulating layer and the second insulating layer, and is connected to the first ground and the second ground. A cross section of the first shield via parallel to the second surface is inscribed in a first virtual rectangle having a long side and a short side perpendicular to the long side. This allows suppression of crosstalk that occurs between the first line and the second line due to leakage of electromagnetic waves near the end portions of the lines.

(2) A high frequency circuit according to a second aspect of the present disclosure includes a first insulating layer; a second insulating layer stacked on the first insulating layer directly or with one or more intermediate layers interposed therebetween; a first ground disposed on a first surface that does not face the second insulating layer among the first surface and a second surface forming two surfaces of the first insulating layer; a first line having a first end portion to which a first alternating-current signal is to be supplied and a second line having a second end portion to which a second alternating-current signal is to be supplied that are disposed between the first insulating layer and the second insulating layer; a second ground disposed on a third surface that does not face the first insulating layer among the third surface and a fourth surface forming two surfaces of the second insulating layer; a third ground disposed between the first insulating layer and the second insulating layer; and a first shield via that is conductive, is located between the first end portion and the second end portion that are isolated from each other in a direction along the fourth surface, extends through at least one insulating layer among the first insulating layer and the second insulating layer, and is connected to the third ground and a ground located on a side on which the at least one insulating layer is located with respect to the first end portion and the second end portion among the first ground and the second ground. A cross section of the first shield via parallel to the second surface is inscribed in a first virtual rectangle having a long side and a short side perpendicular to the long side. This allows suppression of crosstalk that occurs between the first line and the second line due to leakage of electromagnetic waves near the end portions of the lines.
(3) Preferably, in one plane parallel to the second surface, the long side of the first rectangle and a straight line connecting the first end portion and the second end portion define an acute angle of 45 degrees or more. This allows effective suppression of crosstalk that occurs between the first line and the second line. In addition, it is possible to reduce the influence of manufacturing accuracy on the effect of suppressing crosstalk.
(4) More preferably, the first insulating layer has an opening from which the first end portion and the second end portion are exposed. This allows effective suppression of crosstalk that occurs between the first line and the second line. In addition, a processing of drilling from one side, that is, from one side on which the second insulating layer is located, allows manufacture of a high frequency circuit in which crosstalk due to leakage of electromagnetic waves in line end portions is suppressed.
(5) More preferably, the high frequency circuit further includes a first pad and a second pad that are conductive and disposed on the first surface so as to be isolated from the first ground; a first connection via that is conductive, extends through the first insulating layer, and connects the first pad and the first end portion; and a second connection via that is conductive, extends through the first insulating layer, and connects the second pad and the second end portion. The first shield via extends through the first insulating layer and the second insulating layer and connects to the first ground and the second ground. This allows more effective suppression of crosstalk that occurs between the first line and the second line.
(6) Preferably, the high frequency circuit further includes a second shield via that is conductive, extends through an insulating layer through which the first shield via extends among the first insulating layer and the second insulating layer, is connected to a ground to which the first shield via is connected among the first ground and the second ground, and faces the first shield via with the first end portion interposed therebetween. A cross section of the second shield via parallel to the second surface is inscribed in a second virtual rectangle including two perpendicular sides of different lengths. This allows effective suppression of crosstalk that occurs between the first line and the second line. In addition, it is possible to suppress crosstalk between a circuit present on a side on which the first end portion is located and the first and second lines.
(7) More preferably, the high frequency circuit further includes a third shield via that is conductive, extends through the insulating layer through which the first shield via extends, is connected to the ground, and faces the first shield via with the second end portion interposed therebetween. A cross section of the third shield via parallel to the second surface is inscribed in a third virtual rectangle including two perpendicular sides of different lengths. This allows effective suppression of crosstalk that occurs between the first line and the second line. In addition, it is possible to suppress crosstalk between a circuit present on a side on which the second end portion is located and the first and second lines.
(8) More preferably, the high frequency circuit further includes a third line that is disposed on the second surface on a side opposite to a side of the first line on which the first shield via is located and has a third end portion to which a third alternating-current signal is to be supplied. The first alternating-current signal and the third alternating-current signal are differential signals. This allows suppression of crosstalk that occurs between a line pair of the first and third lines transmitting differential signals and the second line.
(9) Preferably, the high frequency circuit further include a fourth line that is disposed on the second surface on a side opposite to a side of the second line on which the first shield via is located and has a fourth end portion to which a fourth alternating-current signal is to be supplied. The second alternating-current signal and the fourth alternating-current signal are differential signals. This allows suppression of crosstalk that occurs between two pairs of line pairs transmitting differential signals, that is, between a line pair of the first and third lines and a line pair of the second and fourth lines.
(10) More preferably, the first shield via is disposed so as to include a center between the first end portion and the second end portion. This allows effective suppression of crosstalk that occurs between the first line and the second line.
(11) More preferably, a center of the first rectangle is located closer to a side where the first line and the second line are present than a center between the first end portion and the second end portion. This allows more effective suppression of crosstalk that occurs between the first line and the second line.
(12) Preferably, the long side of the first rectangle has a length 1.5 times or more a length of the short side of the first rectangle. This ensures suppression of crosstalk that occurs between the first line and the second line.
(13) More preferably, the long side of the first rectangle has a length ½ or more a distance between the first end portion and the second end portion. This further ensures suppression of crosstalk that occurs between the first line and the second line.

Details of Embodiments of Present Disclosure

In the following embodiments, same parts are denoted by same reference numerals. Their names and functions are also the same. Therefore, detailed description thereof will not be repeated.

Figure 2:
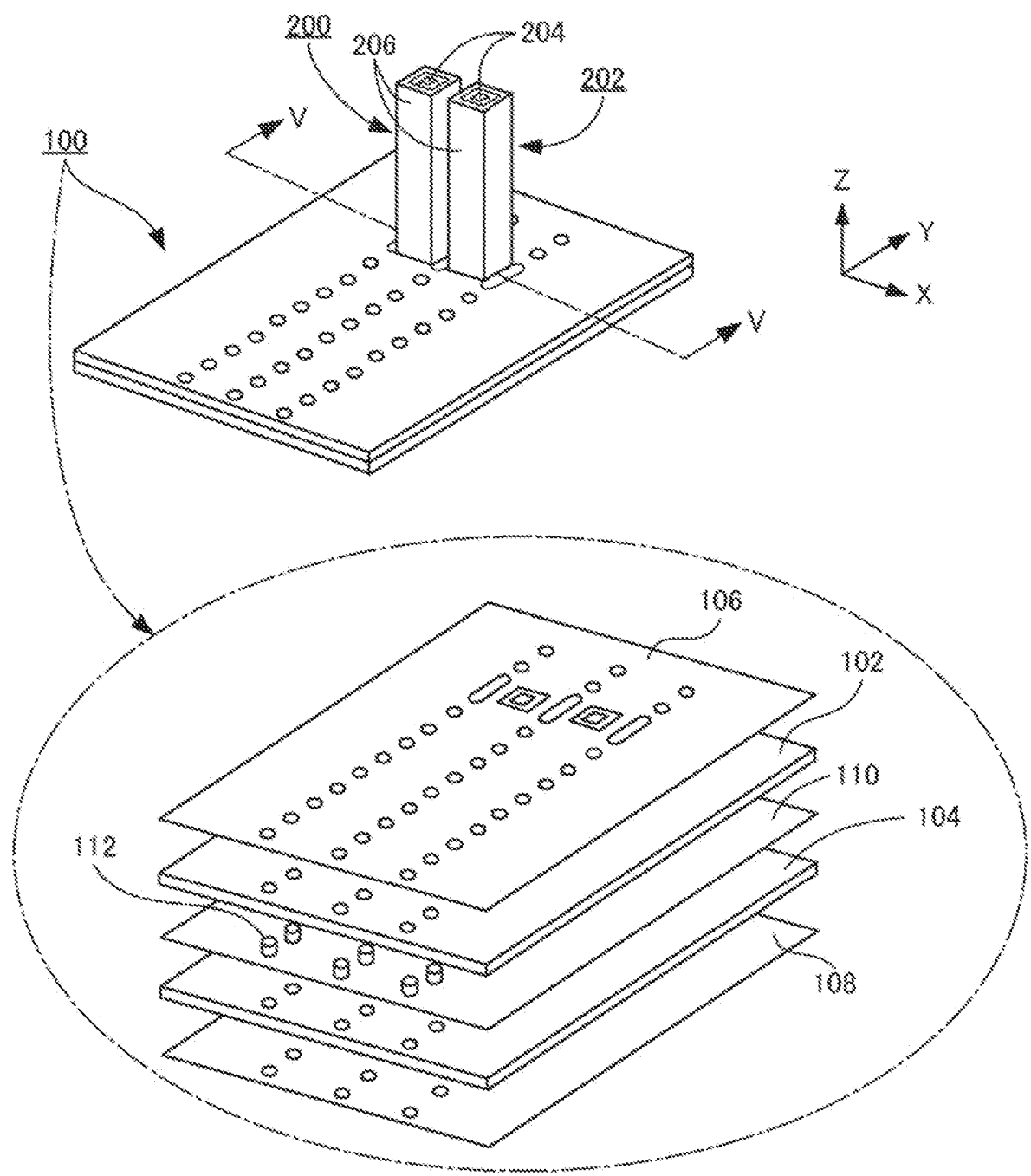
FIG. 2 is a perspective view illustrating a schematic configuration of a high frequency circuit according to an embodiment of the present disclosure.

Referring to FIG. 2, a high frequency circuit 100 according to an embodiment of the present disclosure includes two insulating layers and three conductive layers stacked upon one another. Lines are arranged inside high frequency circuit 100, and alternating-current signals from the outside are supplied to the internal lines by vertical power feeding using a first connector 200 and a second connector 202. Each of first connector 200 and second connector 202 includes a central conductor 204 and an outer conductor 206 for transmitting the alternating-current signals. The alternating-current signals include, for example, high frequency signals equal to or higher than 10 kHz. In FIG. 2, major components of high frequency circuit 100 are illustrated in an exploded view within a one-dot chain line ellipse. That is, high frequency circuit 100 includes a first insulating layer 102, a second insulating layer 104, a first conductive layer 106, a second conductive layer 108, a third conductive layer 110, and a plurality of vias 112. First conductive layer 106 is stacked above first insulating layer 102. Second conductive layer 108 is stacked below second insulating layer 104. Third conductive layer 110 is stacked between first insulating layer 102 and second insulating layer 104. The plurality of vias 112 include two types of shield vias, as described later. Vias 112 protrude from a front surface and a back surface of third conductive layer 110. Insulating member (not illustrated) for protection may be disposed above first conductive layer 106 and below second conductive layer 108. For convenience, XYZ axes perpendicular to one another are defined as illustrated in FIG. 2.

Each of first insulating layer 102 and second insulating layer 104 is formed of a dielectric material having a predetermined thickness. Examples of the dielectric material include fluororesin, epoxy resin, polyphenylene ether (PPE), polyimide, liquid crystal polymer (LCP), and the like. The dielectric material may be FRP (Fiber Reinforced Plastics) containing a glass cloth and any one of fluororesin, epoxy resin, PPE, polyimide, and the like. First insulating layer 102 and second insulating layer 104 may be formed of same dielectric materials or different dielectric materials. Each of first conductive layer 106, second conductive layer 108, third conductive layer 110, and vias 112 is formed of a conductive member such as copper having a predetermined thickness. High-frequency circuit 100 is, for example, a rigid printed circuit board (PCB) or a flexible printed circuit (FPC).

Figure 3A:
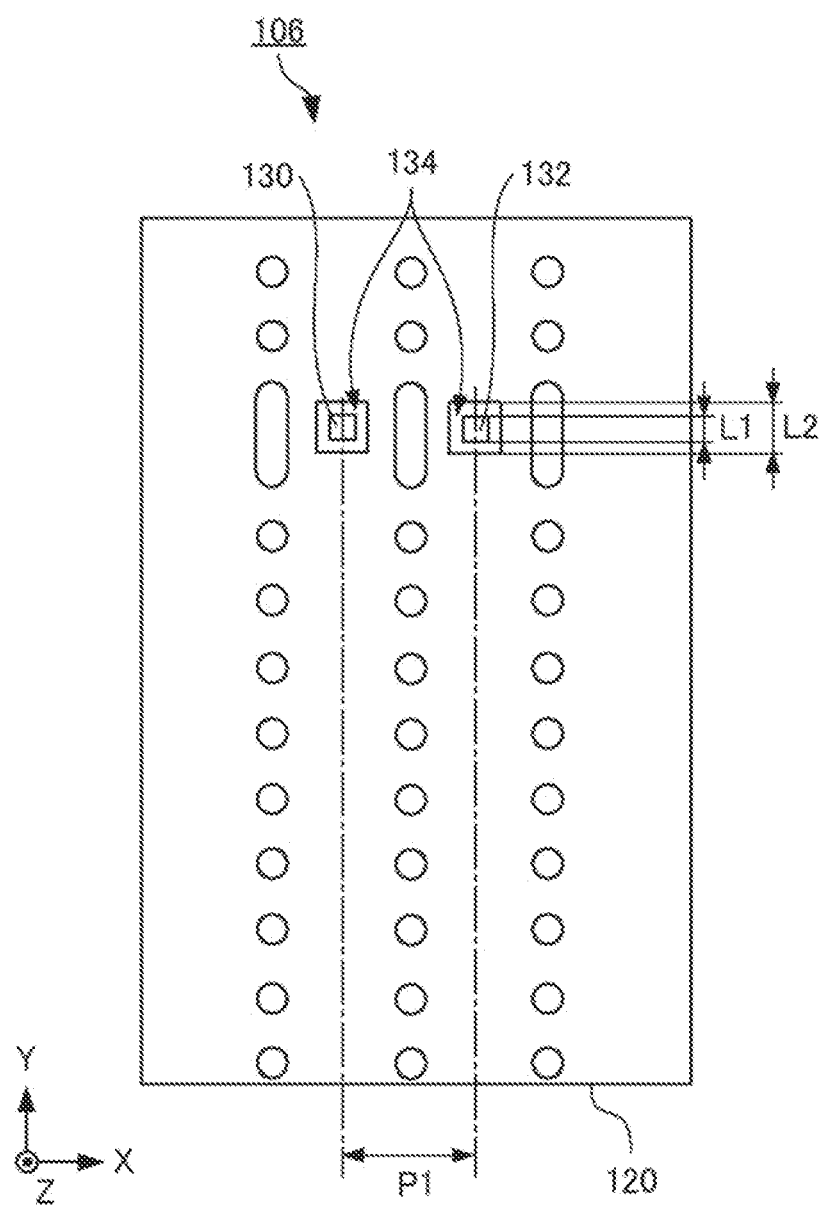
FIG. 3A is a plan view illustrating a first conductive layer of the high frequency circuit illustrated in FIG. 2.
Figure 3B:
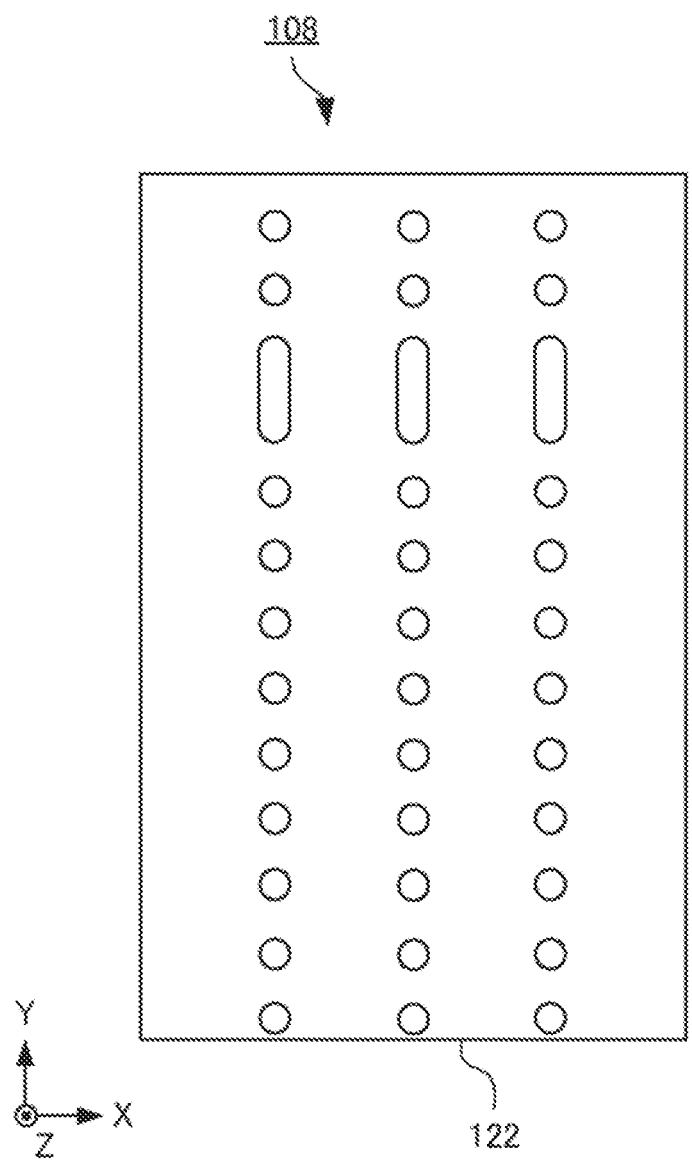
FIG. 3B is a plan view illustrating a second conductive layer of the high frequency circuit illustrated in FIG. 2.

Referring to FIG. 3A, first conductive layer 106 includes a first ground 120, a first pad 130, and a second pad 132. An isolation region 134 is formed around each of first pad 130 and second pad 132, so that first pad 130, second pad 132, and first ground 120 are spaced apart and electrically insulated from one another. Central conductor 204 of first connector 200 illustrated in FIG. 2 is in contact with first pad 130, and outer conductor 206 of first connector 200 is in contact with first ground 120 around first pad 130. Similarly, central conductor 204 of second connector 202 illustrated in FIG. 2 is in contact with second pad 132, and outer conductor 206 of second connector 202 is in contact with first ground 120 around second pad 132. Each of first pad 130 and second pad 132 is a square having a predetermined thickness and a side length of L1. An outer shape of each of isolation regions 134 is a square having a side length of L2. L2 is greater than L1. A center of first pad 130 and a center of second pad 132 are spaced apart from each other at interval P1 in an X-axis direction. For example, thicknesses of first ground 120, first pad 130, and second pad 132 are equal to one another. Referring to FIG. 3B, second conductive layer 108 includes second ground 122 having a predetermined thickness. In first conductive layer 106 and second conductive layer 108, holes having the same shape and size as holes formed in third conductive layer 110 to be described later are formed at corresponding positions. That is, when first conductive layer 106, second conductive layer 108 and third conductive layer 110 are stacked, the corresponding holes formed therein are overlapped.

Figure 3C:
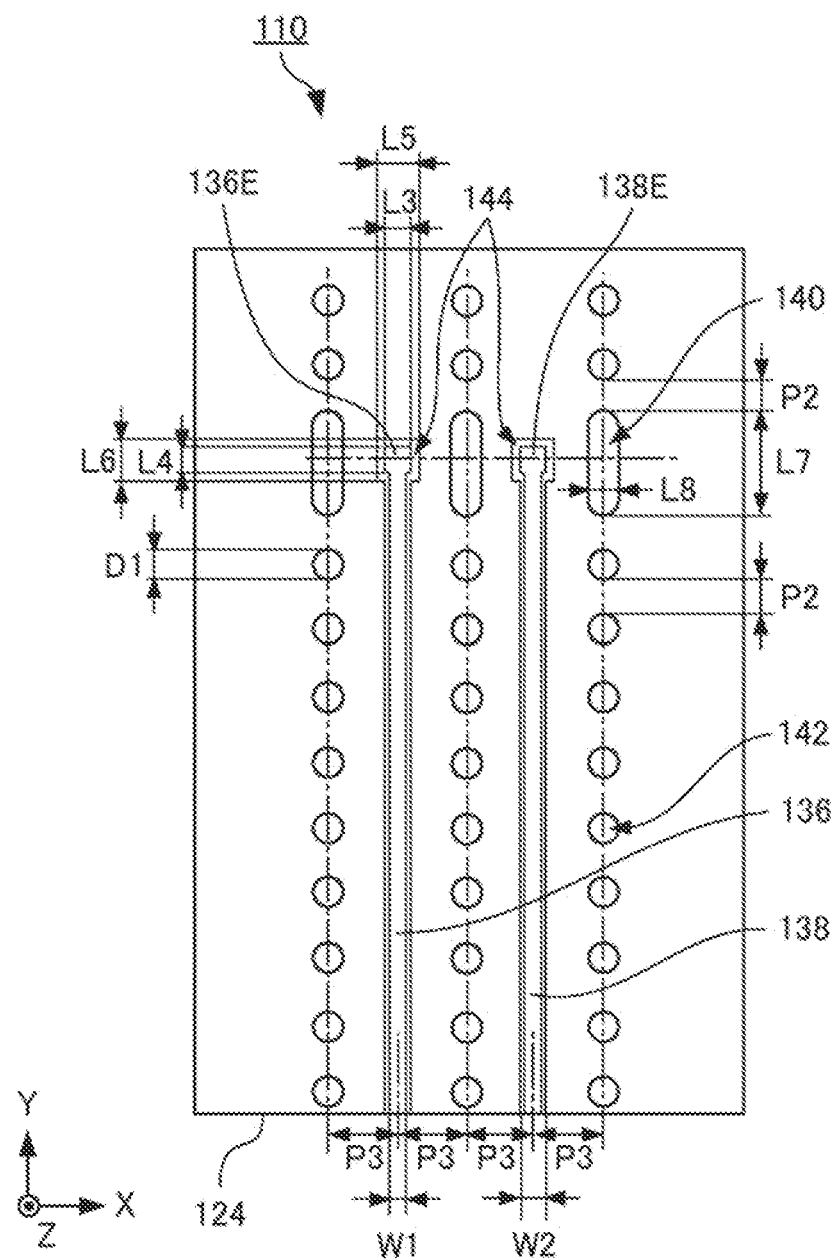
FIG. 3C is a plan view illustrating a third conductive layer of the high frequency circuit illustrated in FIG. 2.

Referring to FIG. 3C, third conductive layer 110 includes a third ground 124 having a predetermined thickness, a first line 136, and a second line 138. First line 136 and second line 138 include a first line end portion 136E and a second line end portion 138E, respectively. First ground 120 illustrated in FIG. 3A, second ground 122 illustrated in FIG. 3B, and third ground 124 are connected to one another through a shield via described later, and are at a same potential. An isolation region 144 is formed around each of first line 136 and second line 138, so that first line 136, second line 138, and third ground 124 are electrically insulated from one another. In third ground 124, long holes 140 are formed between first line end portion 136E and second line end portion 138E, and on both sides of first line end portion 136E and second line end portion 138E. Further, in third ground 124, a plurality of circular holes 142 forming three rows together with long holes 140 are formed along first line 136 and second line 138 that extend in a Y-axis direction. In each of the rows, long hole 140 and the plurality of circular holes 142 are arranged so as to be equally spaced from each other at an interval P2 in the Y-axis direction. Each of first line 136 and second line 138 has a width W1. First line 136, second line 138, and the three rows each formed by long hole 140 and circular holes 142 are arranged at equal intervals of interval P3. Alternating-current signals are transmitted to a circuit for another purpose than high frequency circuit 100 through first line 136 and second line 138. The circuit for another purpose may include a signal processing circuit, an antenna, or the like.

Shape of each of first line end portion 136E and second line end portion 138E is a rectangle in which lengths L3 and L4 of two sides perpendicular to each other are different from each other. In the present disclosure, a rectangle means a rectangle in a narrow sense that does not include a square. Isolation region 144 formed around an extending portion of each of first line 136 and second line 138 has a width W2. Isolation region 144 around each of first line end portion 136E and second line end portion 138E has two sides, which is perpendicular to each other, of lengths L5 and L6. L5 is greater than L3, and L6 is greater than L4.

Each of long holes 140 has an elongated shape and is inscribed in a virtual rectangle in which lengths of two sides perpendicular to each other are different from each other. The virtual rectangle is not illustrated in FIG. 3C. Two sides perpendicular to each other of the virtual rectangle circumscribing each of long holes 140 have lengths L7 and L8. L7 is greater than L8. A long side of the virtual rectangle circumscribing each of long holes 140 is perpendicular to a straight line connecting first line end portion 136E and second line end portion 138E. The straight line connecting first line end portion 136E and second line end portion 138E is, for example, a straight line connecting the centers of first line end portion 136E and second line end portion 138E. The position of the center of each of three long holes 140, first line end portion 136E, and second line end portion 138E has a same Y coordinate. Specifically, each of long holes 140 has a shape in which both end portions in a longitudinal direction are semicircles, diameters of the semicircles are length L8, and two pairs of opposite end points of the two semicircles are respectively connected by two line segments each having a length of L7–L8. Hereinafter, the shapes of long holes 140 are also referred to as rounded rectangles. Shape of each of circular holes 142 is a circle with a diameter D1. As described later, shield vias are to be disposed in long holes 140 and circular holes 142. The shield vias have tubular or columnar shapes and have predetermined heights protruding from third conductive layer 110. An outer shape of each of the shield vias has the same shape and size as a corresponding one of long holes 140 or circular holes 142 in a cross section perpendicular to a Z-axis. Hereinafter, the cross section perpendicular to the Z-axis is referred to as an XY cross section.

Figure 4:
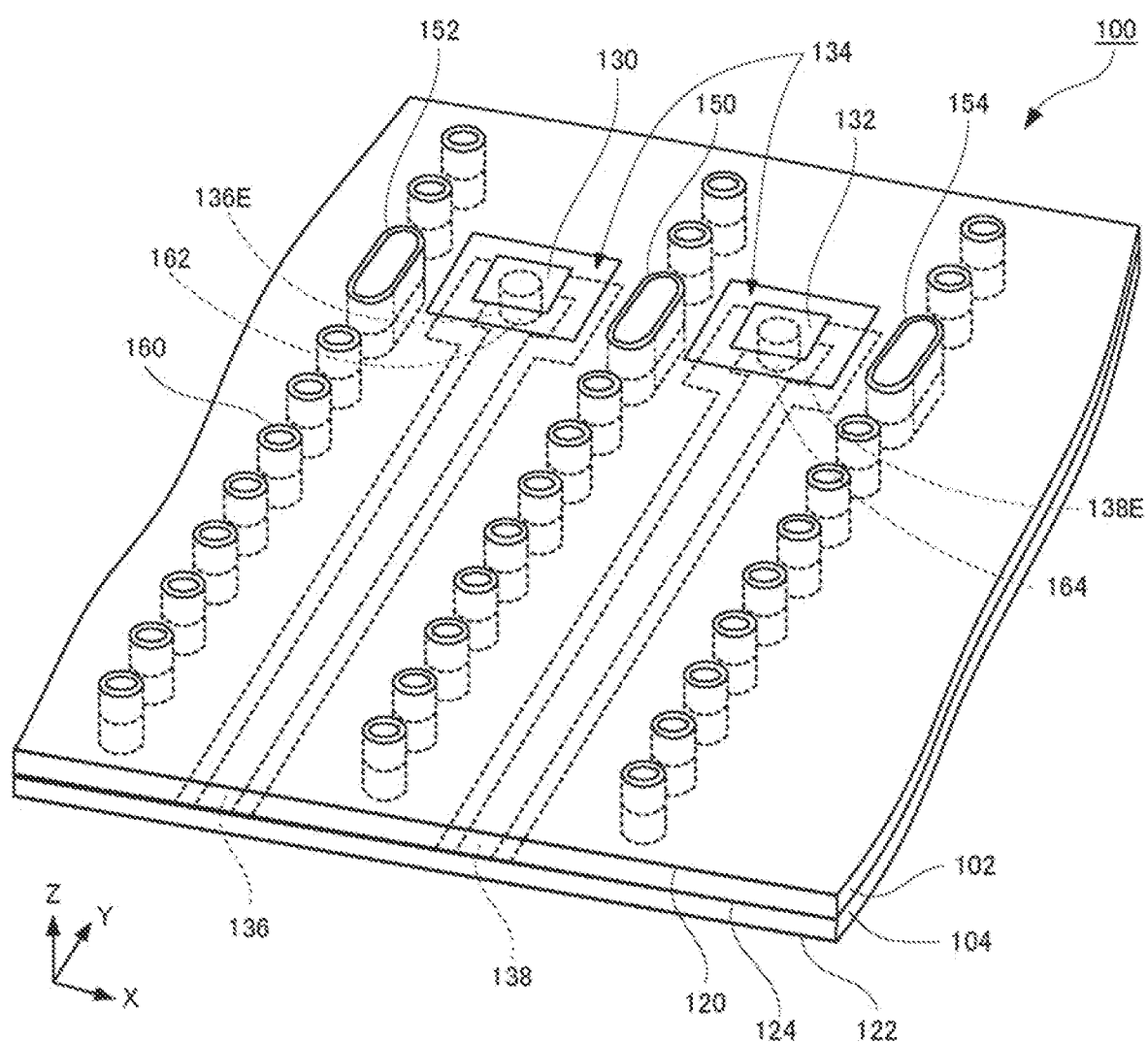
FIG. 4 is a perspective view illustrating a vicinity of a pad of a high frequency circuit according to an embodiment.
Figure 5:
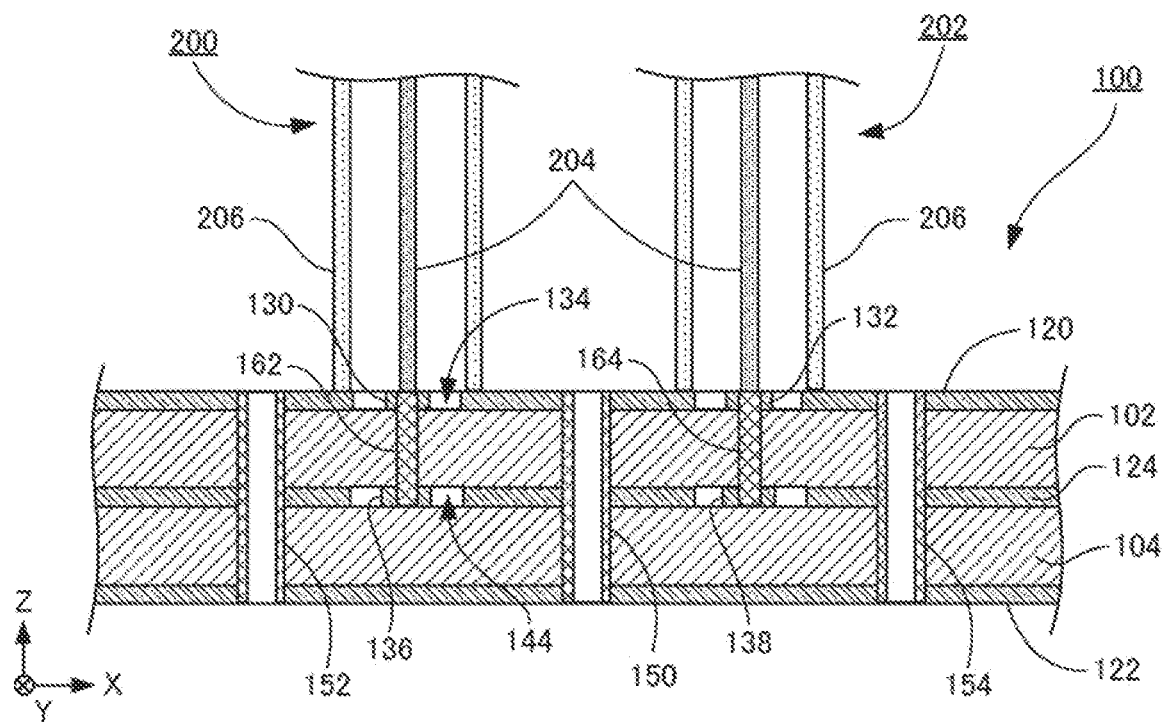
FIG. 5 is a cross-sectional view taken along line V-V illustrated in FIG. 2.
Figure 6:
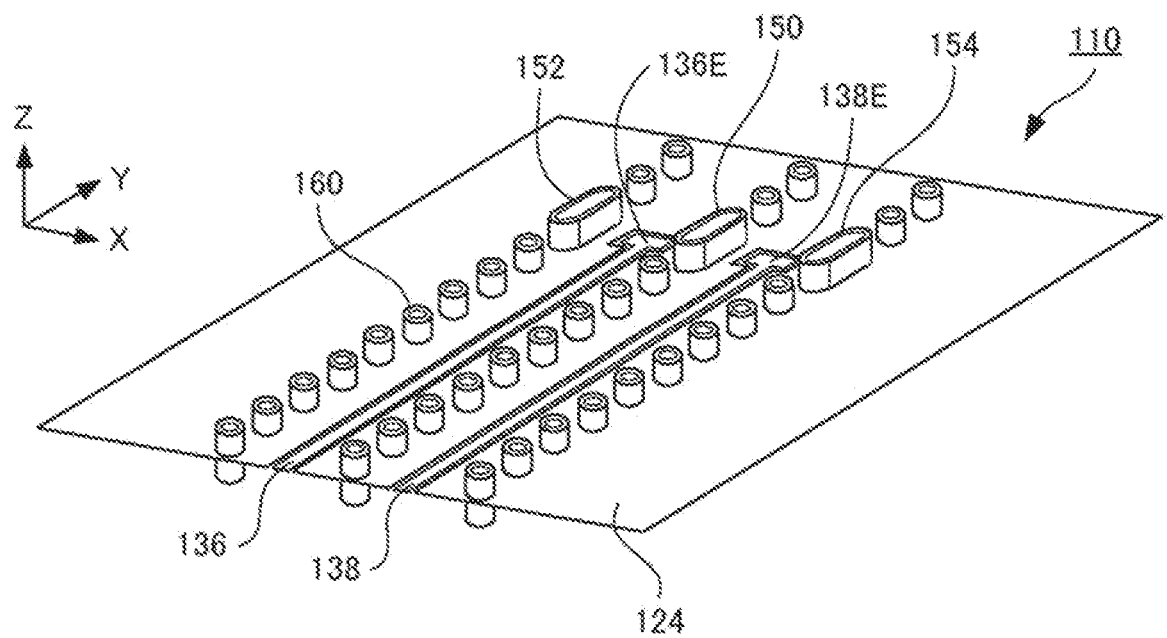
FIG. 6 is a perspective view illustrating a ground and a shield via of an intermediate layer.

Referring to FIGS. 4 and 5, first pad 130, second pad 132, and first ground 120 included in first conductive layer 106 illustrated in FIG. 3A are disposed on first insulating layer 102. First line 136, second line 138, and third ground 124 included in third conductive layer 110 illustrated in FIG. 3C are disposed between first insulating layer 102 and second insulating layer 104. Second ground 122 included in second conductive layer 108 illustrated in FIG. 3B is disposed on a back surface, which is a lower surface, of second insulating layer 104. A first shield via 150, a second shield via 152, a third shield via 154, and a plurality of cylindrical shield vias 160 are disposed so as to extend through a five-layer stacked structure. Referring to FIG. 6, first shield via 150 is located between first pad 130 and second pad 132, and is formed in a tubular shape extending through the five-layer stacked structure in the Z-axis direction. An outer shape of first shield via 150 is a rounded rectangle in the XY cross section. A side surface of first shield via 150 is connected to first ground 120, second ground 122, and third ground 124. Second shield via 152 and third shield via 154 are formed in a similar manner.

The present disclosure is not limited to the configuration illustrated in FIGS. 4 and 5. For example, first shield via 150 may be configured to extend through first insulating layer 102 to be connected to first ground 120 and third ground 124 without extending through second insulating layer 104. Alternatively, first shield via 150 may be configured to extend through second insulating layer 104 to be connected to second ground 122 and third ground 124 without extending through first insulating layer 102. The same applies to second shield via 152 and third shield via 154.

Each of cylindrical shield vias 160 is formed in a cylindrical shape extending through the five-layer stacked structure in the Z-axis direction, and the plurality of cylindrical shield vias 160 are arranged in parallel to first line 136 and second line 138. The side surfaces of cylindrical shield vias 160 are connected to first ground 120, second ground 122, and third ground 124. In FIGS. 4 to 6 and FIG. 7 described later, members incidentally formed depending on a manufacturing method described later are not illustrated.

Figure 7:
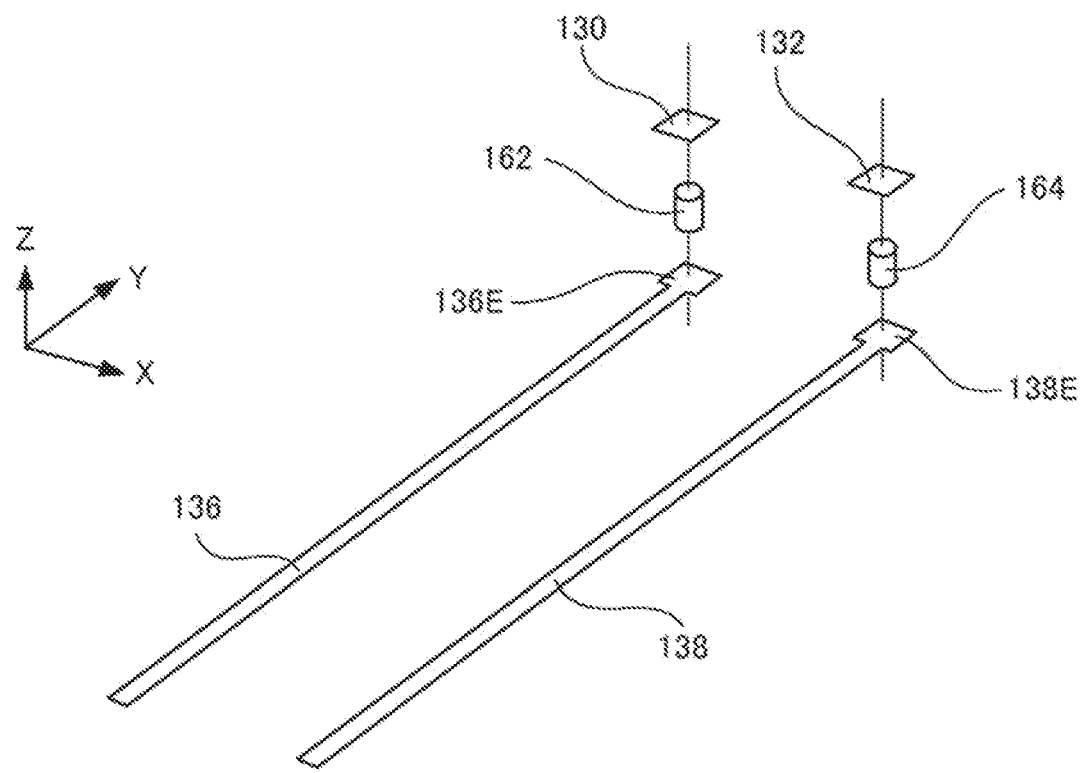
FIG. 7 is a perspective view illustrating a pad, a line and a connection via separately.

Referring to FIG. 5, as described above, central conductors 204 of first connector 200 and second connector 202 are in contact with first pad 130 and second pad 132, respectively, and outer conductors 206 is in contact with first ground 120. Referring to FIGS. 5 and 7, first pad 130 and second pad 132 are respectively connected to first line end portion 136E and second line end portion 138E through first connection via 162 and second connection via 164 which extend through first insulating layer 102. Each of first connection via 162 and second connection via 164 is formed in a columnar shape having a diameter of D2, for example.

As described above, with reference to FIGS. 3A to 3C, a longitudinal direction of each of first shield via 150, second shield via 152, and third shield via 154 is perpendicular to the straight line connecting first line end portion 136E and second line end portion 138E. The longitudinal direction of each of first shield via 150, second shield via 152, and third shield via 154 means a long side direction of each of virtual rectangles circumscribing the respective XY cross sections. Orthogonal projection of each of first shield via 150, second shield via 152, and third shield via 154 onto a YZ plane overlaps orthogonal projections of first connection via 162 and second connection via 164 onto the YZ plane. A row formed by first shield via 150 and a plurality of cylindrical shield vias 160 are formed in parallel with first line 136 and second line 138. Similarly, in parallel with first line 136 and second line 138, a row formed by second shield via 152 and a plurality of cylindrical shield vias 160 and a row formed by third shield via 154 and a plurality of cylindrical shield vias 160 are formed. The three rows described above, first line 136, and second line 138 are disposed at equal intervals of interval P3 illustrated in FIG. 3C.

As described above, high frequency circuit 100 transmits high frequency signals that are supplied from first connector 200 to first pad 130 and from second connector 202 to second pad 132 to a target circuit through first line 136 and second line 138, respectively. Leakage of electromagnetic waves may occur between a signal supply path to first line 136 including first pad 130, first connection via 162, and first line end portion 136E and a signal supply path to second line 138 including second pad 132, second connection via 164, and second line end portion 138E. However, since first shield via 150 is disposed between first connection via 162 and second connection via 164, the leaked electromagnetic waves are shielded by first shield via 150. Therefore, crosstalk between first line 136 and second line 138 can be suppressed. In addition, crosstalk between linear portions of first line 136 and second line 138 disposed on second insulating layer 104 is suppressed by the plurality of cylindrical shield vias 160 arranged between first line 136 and second line 138.

In addition, electromagnetic waves leaked from the signal supply path to first line 136 including first pad 130, first connection via 162, and first line end portion 136E are also shielded by second shield via 152. Electromagnetic waves leaked from the signal supply path to second line 138 including second pad 132, second connection via 164, and second line end portion 138E are also shielded by third shield via 154. Therefore, even when circuits through which high frequency signals are transmitted are present on both sides of first line 136 and second line 138, crosstalk between these circuits and the signal supply paths to first and second lines 136 and 138 can be suppressed. Crosstalk between linear portions of first and second lines 136 and 138 on second insulating layer 104 and circuits present on both sides of first and second lines 136 and 138 is suppressed by the plurality of cylindrical shield vias 160 disposed on both sides of first and second lines 136 and 138.

In order to suppress crosstalk between the signal supply paths to first line 136 and second line 138, it is preferable that a length of first shield via 150, that is, length L7 of the long side of the virtual rectangle circumscribing the XY cross section of first shield via 150 is 1.5 times or more length L8 of the short side. In addition, it is more preferable that length L7 of first shield via 150 is three times or more length L8 of the short side. This ensures that crosstalk between the signal supply paths to first line 136 and second line 138 can be suppressed.

In order to sufficiently suppress crosstalk between the signal supply paths to first line 136 and second line 138, it is preferable that length L7 of first shield via 150 is equal to or greater than ½ of an interval between first line end portion 136E and second line end portion 138E, that is, equal to or greater than ½ of 2×P3. In addition, it is more preferable that length L7 of first shield via 150 is equal to or greater than an interval between first line end portion 136E and second line end portion 138E. This further ensures that crosstalk between the signal supply paths to first line 136 and second line 138 can be suppressed.

In order to suppress crosstalk between the signal supply paths to first line 136 and second line 138, it is preferable that each of second shield via 152 and third shield via 154 is also formed in a shape and size similar to first shield via 150. This allows suppression of crosstalk between first and second lines 136 and 138 and circuits arranged on both sides thereof.

In the above description, the longitudinal directions of first shield via 150, second shield via 152, and third shield via 154 are perpendicular to the straight line connecting first line end portion 136E and second line end portion 138E. In addition, first line 136, second line 138, and the three rows formed by the shield vias are arranged at equal intervals. Although such a configuration is preferable, the shape and position of each of first shield via 150, second shield via 152, and third shield via 154 may be selected as desired in consideration of manufacturing errors and the like.

Figure 8:
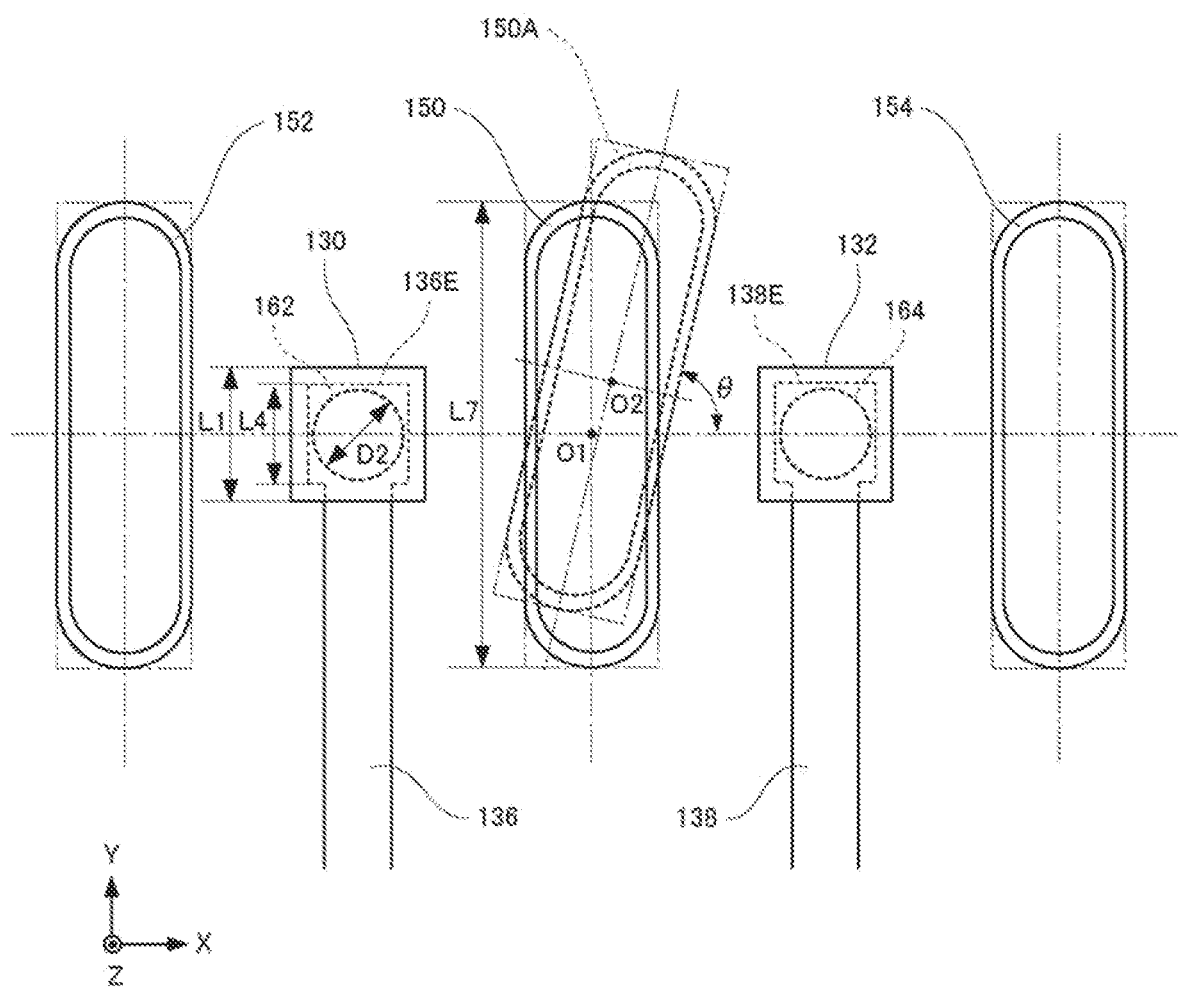
FIG. 8 is a plan view illustrating a vicinity of a pad with a first insulating layer removed.

For example, referring to FIG. 8, first shield via 150, which is desirable to suppress crosstalk between first line 136 and second line 138, is shown as a solid line, and a first shield via 150A, which is formed so as to be shifted from first shield via 150, is shown as a dotted line. In the XY plane, first shield vias 150 and 150A are inscribed in virtual rectangles having the same sizes, but the long sides are inclined with respect to each other and the centers are shifted with respect to each other. That is, in the XY plane, an angle θ at which the straight line connecting first line end portion 136E and second line end portion 138E is inclined with respect to the longitudinal direction of first shield via 150A is less than 90 degrees, and the center O2 of first shield via 150A is shifted to upper right from the center O1 of first shield via 150. However, it is sufficient that θ≥45 (degrees) and the orthogonal projection of first shield via 150A includes the orthogonal projections of first line end portion 136E and second line end portion 138E with a plane perpendicular to the straight line connecting the centers of first line end portion 136E and second line end portion 138E as a projection plane. The length of the orthogonal projection of first shield via 150A in the Y-axis direction is L7×sin θ. With such a positional relationship, first shield via 150A is located between first connection via 162 and second connection via 164 and between first line end portion 136E and second line end portion 138E. In this case, first shield via 150A is disposed so as to include a center between the centers of first line end portion 136E and second line end portion 138E. That is, the center between the centers of first line end portion 136E and second line end portion 138E is located inside first shield via 150A. It should be noted that the inside of the tubular shield vias is not limited to the inside of a thickness of a tube, but includes a space surrounded by the tube. Therefore, first shield via 150A can shield electromagnetic waves leaked from first connection via 162 and first line end portion 136E and electromagnetic waves leaked from second connection via 164 and second line end portion 138E. That is, crosstalk between first line 136 and second line 138 can be suppressed. Therefore, even when the position of first shield via 150A is shifted from a design position, for example, the position of first shield via 150, crosstalk can be sufficiently suppressed, and the influence of manufacturing accuracy on the crosstalk suppression effect can be reduced.

The positional relationship of second shield via 152 and third shield via 154 with respect to first connection via 162, second connection via 164, first line end portion 136E, and second line end portion 138E may be similar to that of first shield via 150A.

A method of forming high frequency circuit 100 will be described. A substrate in which copper foil is stacked on two surfaces of a resin substrate and a substrate in which copper foil is stacked only on one surface of two surfaces of another resin substrate are prepared. Hereinafter, the substrate having copper foil stacked on two surfaces thereof and the substrate having copper foil stacked on only one surface thereof are referred to as a first substrate and a second substrate, respectively. The copper foil on one surface of the first substrate is etched to form a circuit. That is, first line 136 having first line end portion 136E, second line 138 having second line end portion 138E, and third ground 124 are formed. Subsequently, in the first substrate, holes passing through first line end portion 136E and second line end portion 138E and extending through the first substrate in a thickness direction thereof is formed by drilling or laser processing, and the holes are plated with copper. As a result, first connection via 162 and second connection via 164 are formed to be connected to first line end portion 136E and second line end portion 138E, respectively. Subsequently, using an adhesive such as a bonding sheet, a surface of the second substrate on which the copper foil is not stacked is bonded to the surface of the first substrate on which a circuit is formed. Subsequently, through holes extending through the stacked first substrate and second substrate are formed by processing with a drill or laser. Accordingly, the copper foil stacked on the second substrate becomes second ground 122. The through holes are plated with copper to form copper foil to be first ground 120 in a subsequent step, and first shield via 150, second shield via 152, third shield via 154, and cylindrical shield vias 160 that each connects second ground 122 and third ground 124. Finally, exposed copper foil of the first substrate is etched to form first ground 120, and first pad 130 and second pad 132 that are connected to first connection via 162 and second connection via 164, respectively.

As another forming method, the surface of the second substrate on which copper foil is not stacked may be bonded to the surface of the first substrate on which a circuit is formed before holes are formed in portions corresponding to first line end portion 136E and second line end portion 138E in the first substrate. In this case, in addition to the formation of through holes in the first substrate and the second substrate that are stacked as described above, holes that extend from first pad 130 to first line end portion 136E and from second pad 132 to second line end portion 138E may be formed using a laser, and the holes and the through holes may be plated with copper. Through the step of plating copper, copper is also formed on exposed surfaces of first ground 120 and second ground 122. That is, in the configuration illustrated in FIGS. 4 and 5, copper is formed on the exposed surface of each of first ground 120 and second ground 122 so as to be connected to first shield via 150, second shield via 152, third shield via 154, and cylindrical shield vias 160. In addition, increasing a plating thickness allows first shield via 150, second shield via 152, third shield via 154, and cylindrical shield vias 160 to be formed in a columnar shape with a solid core. Cylindrical shield vias 160 may be filled with resin inside the cylinders.

First Modification

Figure 9:
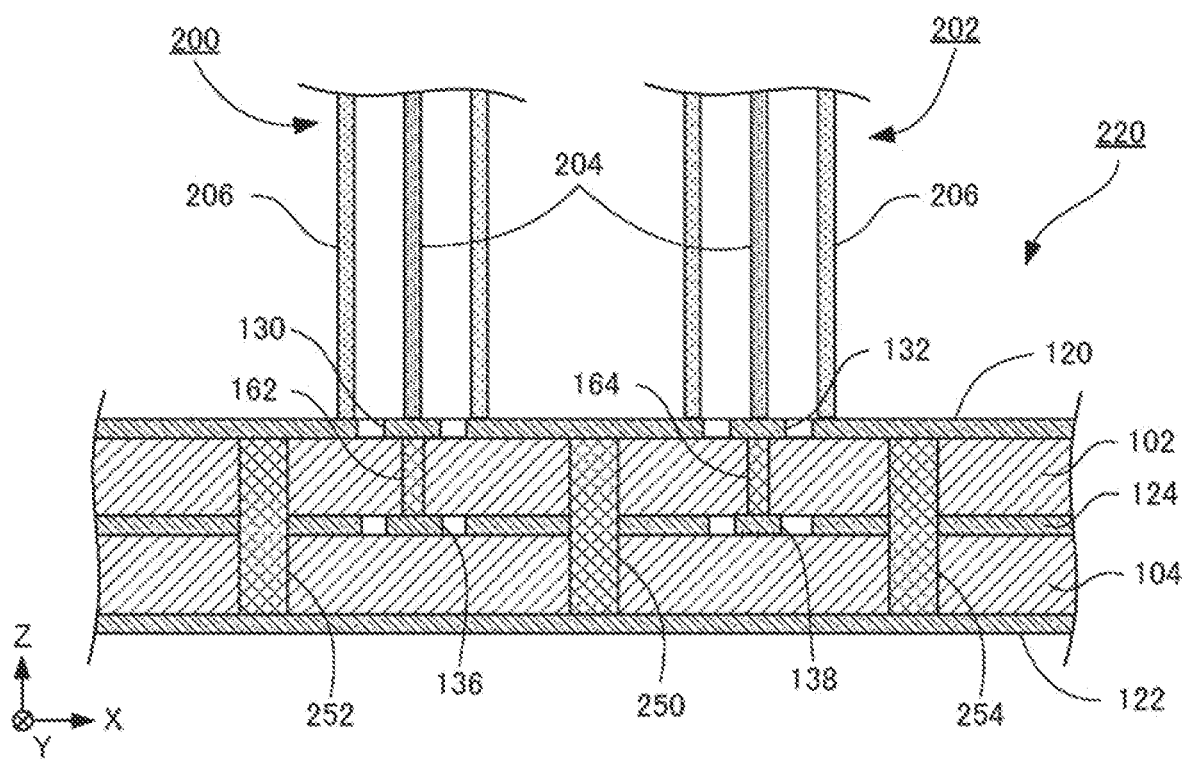
FIG. 9 is a cross-sectional view illustrating a high frequency circuit according to a first modification.

In the above description, each of first shield via 150, second shield via 152, third shield via 154, and a plurality of cylindrical shield vias 160 extends through first ground 120 and second ground 122 and is connected to first ground 120 and second ground 122. However, the present disclosure is not limited thereto. Referring to FIG. 9, each of shield vias of a high frequency circuit 220 according to a first modification connects first ground 120 and second ground 122 without extending through first ground 120 and second ground 122.

Referring to FIG. 9, in high frequency circuit 220, first shield via 150, second shield via 152, and third shield via 154 are respectively replaced with a first shield via 250, a second shield via 252, and a third shield via 254 as compared with high frequency circuit 100 in FIG. 5. Each of first shield via 250, second shield via 252, and third shield via 254 has a columnar shape whose XY cross section is a rounded rectangle, and has upper and lower end faces in contact with first ground 120 and second ground 122, respectively without extending through first ground 120 and second ground 122. In addition, high frequency circuit 220 includes columnar shield vias (not illustrated) that are connected to first ground 120 and second ground 122 without extending thorough first ground 120 and second ground 122, instead of cylindrical shield vias 160 of high frequency circuit 100. The other configuration of high frequency circuit 220 is the same as that of high frequency circuit 100. This allows suppression of crosstalk that occurs between signal supply paths to first line 136 and second line 138.

Second Modification

In the above description, alternating-current signals which are high frequency signals are supplied to first line 136 from first connector 200 through first pad 130 and to second line 138 from second connector 202 through second pad 132, respectively. However, the present disclosure is not limited thereto. A high frequency circuit according to a second modification is intended to suppress crosstalk between a plurality of pairs of pads adjacent to each other, each pair of which includes two pads for supplying differential signals. Hereinafter, the two pads for supplying differential signals are referred to as a pad pair.

Figure 10:
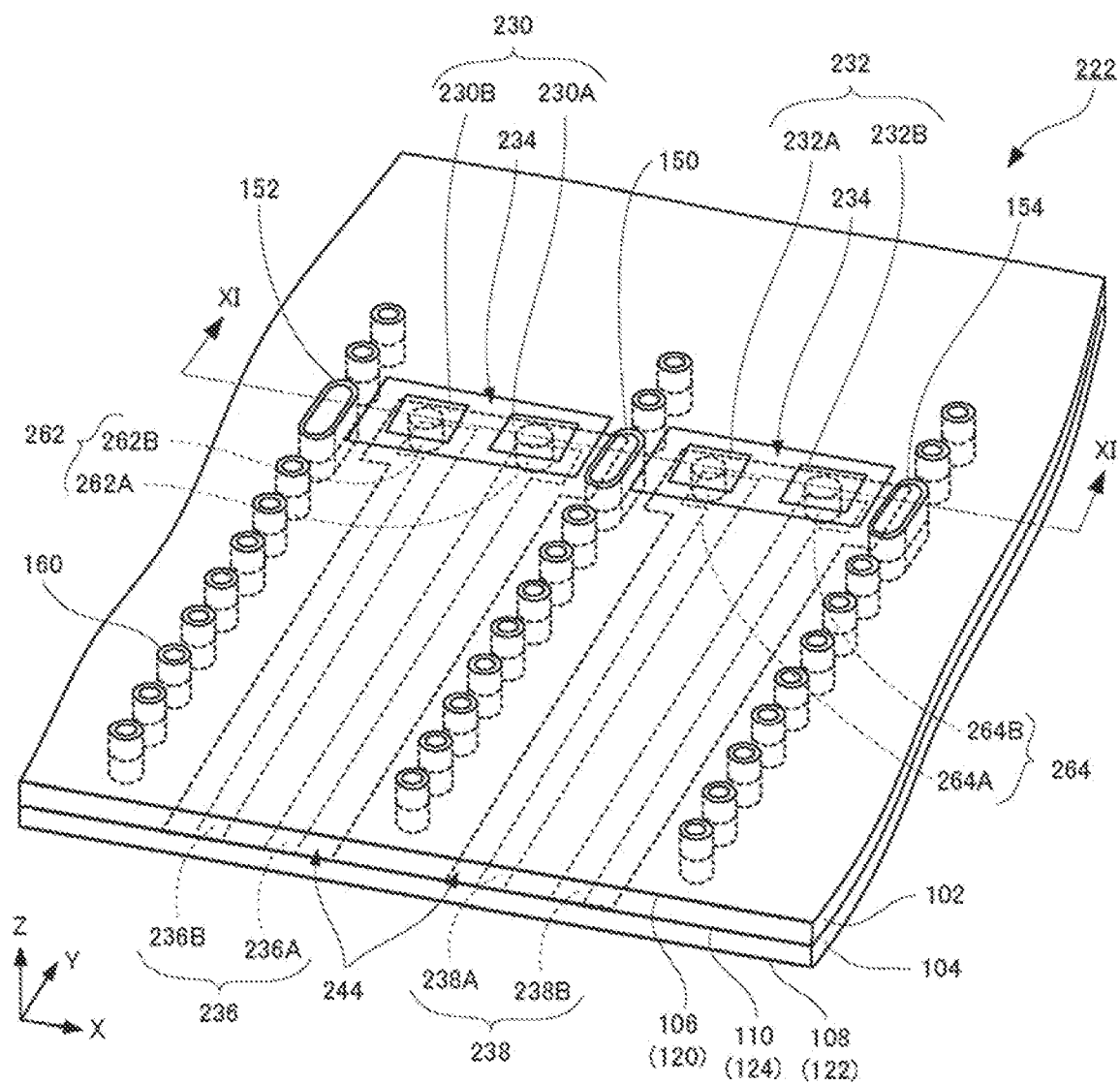
FIG. 10 is a perspective view illustrating a high frequency circuit according to the second modification.
Figure 11:
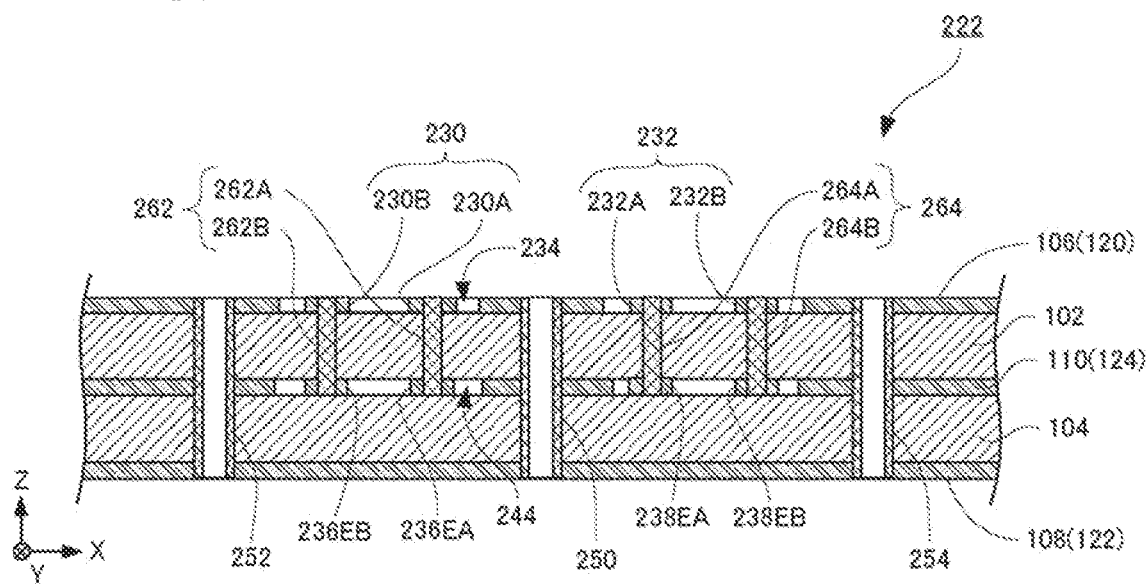
FIG. 11 is a cross-sectional view taken along line XI-XI illustrated in FIG. 10.

Referring to FIGS. 10 and 11, a high frequency circuit 222 according to a second modification includes first insulating layer 102, second insulating layer 104, first conductive layer 106, second conductive layer 108, and third conductive layer 110 as in high frequency circuit 100 illustrated in FIG. 4. First insulating layer 102, second insulating layer 104, first conductive layer 106, second conductive layer 108, and third conductive layer 110 are stacked upon one another. In the following description, difference between high frequency circuit 222 and high frequency circuit 100 will be mainly described without redundant description.

In high frequency circuit 222, instead of first pad 130 and second pad 132 of high frequency circuit 100 illustrated in FIG. 4, a first pad pair 230 and a second pad pair 232 are formed on first insulating layer 102. First pad pair 230 includes pads 230A and 230B, and second pad pair 232 includes pads 232A and 232B. Isolation regions 234 are formed around first pad pair 230 and second pad pair 232.

Third conductive layer 110 includes a first line pair 236 and a second line pair 238 formed on second insulating layer 104, instead of first line 136 and second line 138 of high frequency circuit 100 illustrated in FIG. 4. First line pair 236 includes a line 236A and a line 236B, and second line pair 238 includes a line 238A and a line 238B. Isolation regions 244 are formed around first line pair 236 and second line pair 238. Similarly to high frequency circuit 100, pad 230A and pad 230B are connected to end portion 236EA of line 236A and end portion 236EB of line 236B through connection via 262A and connection via 262B, respectively. In addition, pad 232A and pad 232B are connected to end portion 238EA of line 238A and end portion 238EB of line 238B through connection via 264A and connection via 264B, respectively.

First shield via 150 is disposed between first pad pair 230 and second pad pair 232 and between connection vias corresponding thereto. Second shield via 152 and third shield via 154 are disposed on both sides of first pad pair 230 and second pad pair 232. In addition, high frequency circuit 222 includes a plurality of cylindrical shield vias 160. Similarly to high frequency circuit 100 illustrated in FIG. 4, first shield via 150, second shield via 152, third shield via 154, and the plurality of cylindrical shield vias 160 are arranged in three rows parallel to extending directions of first line pair 236 and second line pair 238.

Conditions required for first shield via 150 of high frequency circuit 222 to suppress crosstalk between signal supply paths to first line pair 236 and second line pair 238 may be obtained in a manner similar to described above. That is, in FIGS. 3A to 7, the conditions are obtained by replacing first pad 130 and second pad 132 with pad 230A and pad 232A, respectively, and replacing first line end portion 136E and second line end portion 138E with end portion 236EA and end portion 238EA, respectively. For example, it is preferable that a length of first shield via 150 may be ½ or more a distance between end portion 236EA and end portion 238EA. In order to suppress crosstalk between the signal supply paths to first line pair 236 and second line pair 238, each of second shield via 152 and third shield via 154 is also preferably formed in a shape and size similar to first shield via 150. This allows suppression of crosstalk between first and second line pairs 236 and 238 and circuits disposed on both sides thereof.

In addition, the arrangement of first shield via 150 of high frequency circuit 222 may be the same as a case where first pad 130 and second pad 132 are replaced with pad 230A and pad 232A, respectively, and first line end portion 136E and second line end portion 138E are replaced with end portion 236EA and end portion 238EA, respectively, in FIG. 8. That is, in the XY plane, an angle at which a straight line connecting end portion 236EA and end portion 238EA is inclined with respect to a longitudinal direction of first shield via 150 may be 45 degrees or more. The orthogonal projection of first shield via 150 may include orthogonal projections of end portion 236EA and end portion 238EA with a plane perpendicular to a straight line connecting the centers of end portion 236EA and end portion 238EA as a projection plane. In such a positional relationship, first shield via 150 is located between connection via 262A connecting end portion 236EA and pad 230A and connection via 264A connecting end portion 238EA and pad 232A, and between end portion 236EA and end portion 238EA. In this case, first shield via 150 is disposed so as to include a center between the centers of end portion 236EA and end portion 238EA. That is, the center between the centers of end portion 236EA and end portion 238EA is located inside first shield via 150. Accordingly, first shield via 150 can suppress crosstalk between signal supply paths to first line pair 236 and second line pair 238.

Third Modification

In the above description, pads for vertically supplying an alternating-current power to internal lines are provided on the surface of first insulating layer 102, and the internal lines and the pads are connected to each other through connection vias. However, the present disclosure is not limited thereto. A high frequency circuit according to a third modification is formed in a state in which end portions of the internal lines are exposed without providing the pads.

Figure 12:
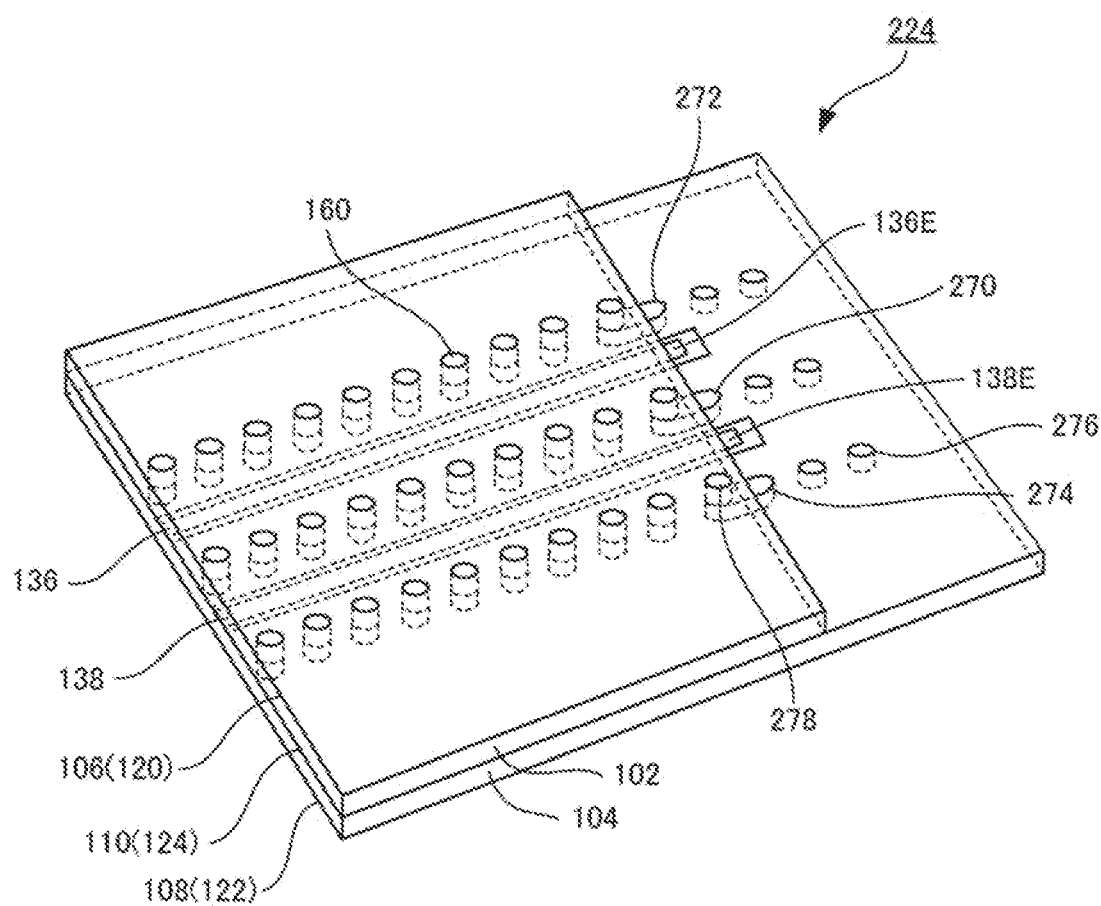
FIG. 12 is a perspective view illustrating a high frequency circuit according to a third modification.

Referring to FIG. 12, a high frequency circuit 224 according to a third modification includes a first shield via 270, a second shield via 272, a third shield via 274, cylindrical shield vias 278 formed thereon, and cylindrical shield vias 276. In high frequency circuit 224, first pad 130, second pad 132, first connection via 162, and second connection via 164 are removed, and portions of first insulating layer 102 and first conductive layer 106 are removed, as compared with high frequency circuit 100 illustrated in FIG. 5. In high frequency circuit 224, first shield via 150, second shield via 152, and third shield via 154 are respectively replaced with first shield via 270, second shield via 272, and third shield via 274, as compared with high frequency circuit 100 illustrated in FIG. 5. Accordingly, isolation regions 134 are not formed in high frequency circuit 224, and first line end portion 136E and second line end portion 138E are exposed. The other configuration of high frequency circuit 224 is the same as that of high frequency circuit 100 illustrated in FIG. 5. In high frequency circuit 224, each of shield vias is formed in a tubular shape as in high frequency circuit 100 illustrated in FIG. 5, however, in FIG. 12, the outer shape is illustrated in a columnar shape for the sake of convenience. Hereinafter, the configuration of high frequency circuit 224 will be described with reference to the configuration of high frequency circuit 100 illustrated in FIG. 5.

First shield via 270, second shield via 272, third shield via 274, and each of cylindrical shield vias 276 extend through second insulating layer 104, second conductive layer 108, and third conductive layer 110 to connect second ground 122 and third ground 124. Each of cylindrical shield vias 278 extends through first insulating layer 102 and first conductive layer 106 to connect first ground 120 and third ground 124. In order to supply alternating-current signals to first line 136 and second line 138, central conductors 204 of first connector 200 and second connector 202 illustrated in FIG. 5 are brought into contact with first line end portion 136E and second line end portion 138E, respectively. Accordingly, first insulating layer 102 may be formed such that central conductors 204 of first connector 200 and second connector 202 are in contact with first line end portion 136E and second line end portion 138E, respectively. That is, first insulating layer 102 and first conductive layer 106 need not be removed in a wide range, as illustrated in FIG. 12. At least, first insulating layer 102 and first conductive layer 106 may not be present in a predetermined region above first line end portion 136E and second line end portion 138E.

First shield via 270, second shield via 272 and third shield via 274 are different in height from first shield via 150, second shield via 152, and third shield via 154 of high frequency circuit 100 illustrated in FIG. 5, but formed in a similar shape. The positional relationship between first, second and third shield vias 270, 272, and 274, and first and second line end portions 136E and 138E and cylindrical shield vias 160 in the XY plane is a similar to that of high frequency circuit 100 illustrated in FIG. 5. That is, first shield via 270 is disposed between first line end portion 136E and second line end portion 138E, and second shield via 272 and third shield via 274 are disposed on both sides of first line end portion 136E and second line end portion 138E. Therefore, leakage of electromagnetic waves in first line end portion 136E and second line end portion 138E can be shielded by first shield via 270, so that crosstalk between first line 136 and second line 138 can be suppressed. In addition, even when circuits are present on both sides of first line end portion 136E and second line end portion 138E, crosstalk between the circuits and first and second line end portions 136E and 138E can be suppressed by second shield via 272 and third shield via 274.

This eliminates a need to perform a processing of drilling from one side of a substrate, in which first insulating layer 102, second insulating layer 104, and third conductive layer 110 are stacked, that is, from one side of the substrate on which first insulating layer 102 is located, in a vicinity of the end portions of the lines in a case where a processing of drilling from both sides of the substrate is performed to form the shield vias. In addition, even in a case where it is difficult to perform a processing of drilling, in the vicinity of the end portions of the lines, from one side, that is, one side on which first insulating layer 102 is located, it is possible to manufacture a high frequency circuit in which crosstalk due to leakage of electromagnetic waves at the end portions of the lines is suppressed.

Fourth Modification

The configuration described in the third modification in which pads and connection vias are not provided can be also applied to a high frequency circuit that transmits a differential signal. A high frequency circuit according to a fourth modification is formed in which pads are not provided and end portions of internal lines are exposed, and transmits a differential signal.

Figure 13:
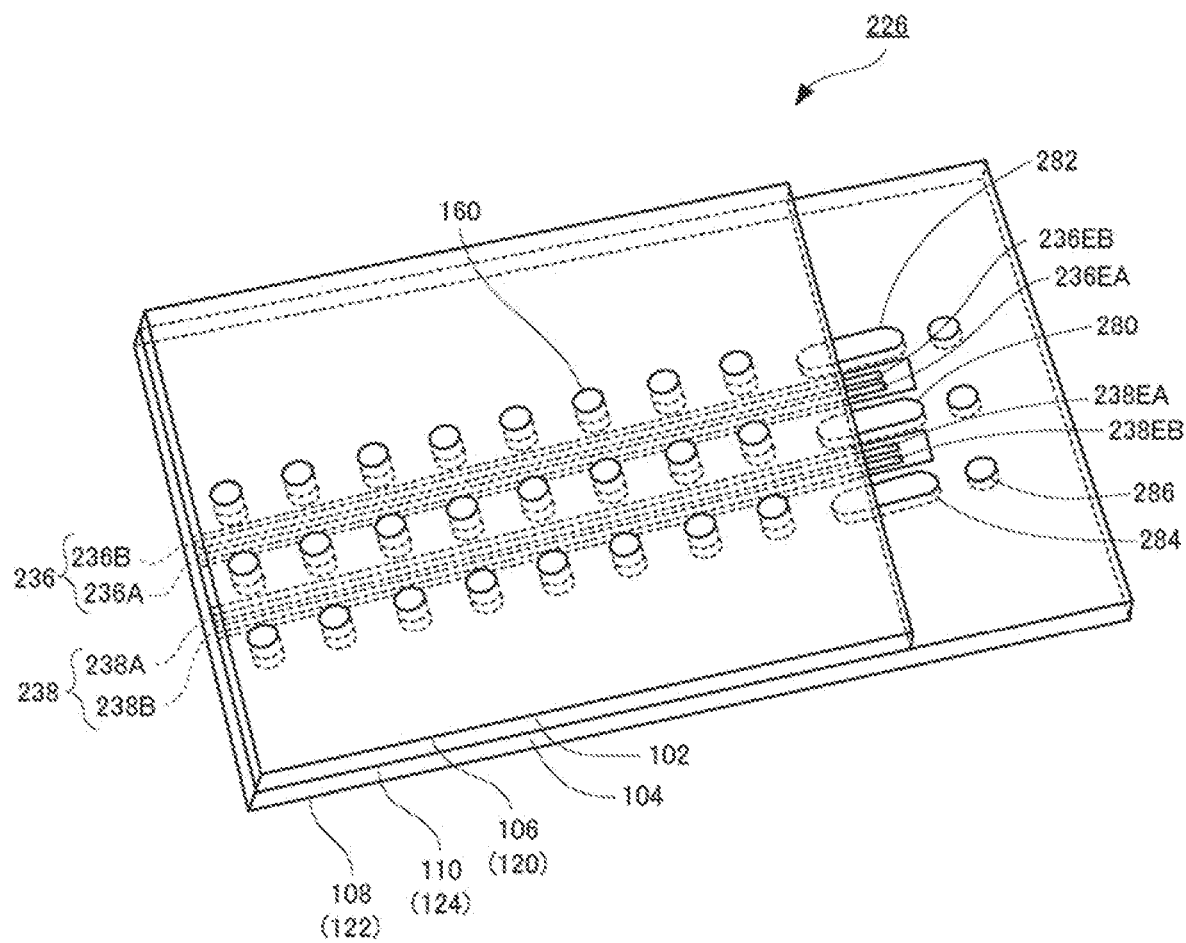
FIG. 13 is a perspective view illustrating a high frequency circuit according to a fourth modification.

Referring to FIG. 13, a high frequency circuit 226 according to the fourth modification includes a first shield via 280, a second shield via 282, and a third shield via 284. In high frequency circuit 226, first pad pair 230, second pad pair 232, a first connection via pair 262, and a second connection via pair 264 are removed, and portions of first insulating layer 102 and first conductive layer 106 are removed, as compared with high frequency circuit 222 illustrated in FIG. 10. In high frequency circuit 226, first shield via 250, second shield via 252, and third shield via 254 are replaced with first shield via 280, second shield via 282, and third shield via 284, respectively, as compared with high frequency circuit 222 illustrated in FIG. 10. Therefore, isolation region 234 is not formed in high frequency circuit 226. The other configuration of high frequency circuit 226 is the same as that of high frequency circuit 222 illustrated in FIG. 10. In high frequency circuit 226, each of shield vias is formed in a tubular shape as in high frequency circuit 222 illustrated in FIG. 10, but is illustrated in a columnar outer shape in FIG. 13 for the sake of convenience. Hereinafter, the configuration of high frequency circuit 226 will be described with reference to the configuration of high frequency circuit 222 illustrated in FIG. 10.

First shield via 280, second shield via 282, third shield via 284, and each of cylindrical shield vias 286 extend through second insulating layer 104, second conductive layer 108, and third conductive layer 110 to connect second ground 122 and third ground 124. In order to supply differential alternating-current signals, central conductors of four connectors are brought into contact with end portion 236EA, end portion 236EB, end portion 238EA, and end portion 238EB, respectively. Therefore, first insulating layer 102 may be formed such that the central conductors of the four connectors are in contact with end portion 236EA, end portion 236EB, end portion 238EA, and end portion 238EB, respectively. That is, first insulating layer 102 and first conductive layer 106 may not be removed in a wide range as illustrated in FIG. 13. At least, first insulating layer 102 and first conductive layer 106 may not be present in a predetermined region above end portion 236EA, end portion 236EB, end portion 238EA, and end portion 238EB.

First shield via 280, second shield via 282, and third shield via 284 are different in height from first shield via 150, second shield via 152, and third shield via 154 of high frequency circuit 222 illustrated in FIG. 10, but are formed in a similar shape. The positional relationship between first, second, and third shield vias 280, 282, and 284, and end portions 236EA, 236EB, 238EA, and 238EB and cylindrical shield vias 160 in the XY plane is similar to that of high frequency circuit 222 illustrated in FIG. 10. That is, first shield via 280 is disposed between end portion 236EA and end portion 238EA, and second shield via 282 and third shield via 284 are disposed on both sides of end portion 236EB and end portion 238EB. Therefore, leakage of electromagnetic waves in end portion 236EA and end portion 238EA can be shielded by first shield via 280, so that crosstalk between first line pair 236 and second line pair 238 can be suppressed. In addition, even when circuits are present on both sides of end portion 236EB and end portion 238EB, crosstalk between the circuits and end portions 236EB and 238EB can be suppressed by second shield via 282 and third shield via 284.

In the above description, the pads are provided on the surface of the substrate and the pads are connected to the lines inside the substrate by the connection vias or the end portions of the lines inside the substrate are exposed. However, the present disclosure is not limited thereto. It is possible to have a configuration in which the pads are not provided on the surface of the substrate and the connection vias are exposed. Bringing a central conductor of a connector for supplying an alternating-current signal into contact with an exposed end portion of the connection via allows supply of the alternating-current signal to a line inside the substrate. Further, the pad and the connection via may be integrally formed.

In the above description, suppressing crosstalk between lines that each transmits an alternating-current signal through one line or between line pairs that transmit a differential signal. However, the present disclosure is not limited thereto. Crosstalk between one line for transmitting an alternating-current signal and a line pair for transmitting a differential signal may be suppressed. That is, as described above, a tubular or columnar shield via having an outer shape of a rounded rectangle in the XY cross section is disposed between an end portion of one line for transmitting an alternating-current signal and end portions of one line pair for transmitting a differential signal. For example, in high frequency circuit 222 illustrated in FIG. 10, the configuration of second line pair 238, second connection via pair 264, and second pad pair 232 may be replaced with the configuration of second line 138, second connection via 164, and second pad 132 illustrated in FIG. 4 to form a high frequency circuit. Such a high frequency circuit allows suppression of crosstalk between signal supply paths to first line pair 236 and a signal supply path to replaced second line 138.

In the above description, two lines or two pairs of line pairs extend in parallel within a predetermined range from the respective pads. However, the present disclosure is not limited thereto. Even when the lines connected to the two pads or the two pairs of pad pairs are not parallel and inclined at a predetermined angle with respect to each other, for example, 90 degrees, or the two lines extend in opposite directions, crosstalk between the pads may occur. Therefore, as described above, when a shield via whose cross section parallel to a surface of a substrate is a rounded rectangle is provided between two pads or between two pairs of pad pairs, crosstalk due to leakage of electromagnetic waves in end portions of the lines can be suppressed.

The shapes of pads, line end portions, and isolation regions around them are not limited to the above-described shapes and may be any shapes. For example, first pad 130, second pad 132, and isolation regions 134 of high frequency circuit 100 illustrated in FIGS. 2 to 5 may have a circular shape or a rectangular shape in which lengths of two adjacent sides are different. First line end portion 136E, second line end portion 138E, and isolation regions 144 may have a square shape or a circular shape. Further, the shapes of first connector 200 and second connector 202 illustrated in FIG. 2, which are connectors for supplying alternating-current signals, are not limited to a rectangular tubular shape, and may be any shapes. First connector 200 and second connector 202 may have, for example, cylindrical shapes. The same applies to the high frequency circuit for transmitting a differential signal illustrated in FIG. 10 and the like.

In the above description, third ground 124 is disposed around first line 136, second line 138, and the like in FIG. 3C in third conductive layer 110 in which lines are disposed. However, the present disclosure is not limited thereto. Third ground 124 may not be provided. For example, in high frequency circuit 100 illustrated in FIG. 4, first shield via 150, second shield via 152, third shield via 154, and cylindrical shield vias 160 are connected to first ground 120 and second ground 122. Therefore, it is possible to suppress crosstalk between the signal supply paths formed by the pads, the connection vias, and the end portions and crosstalk between the lines.

Figure 14:
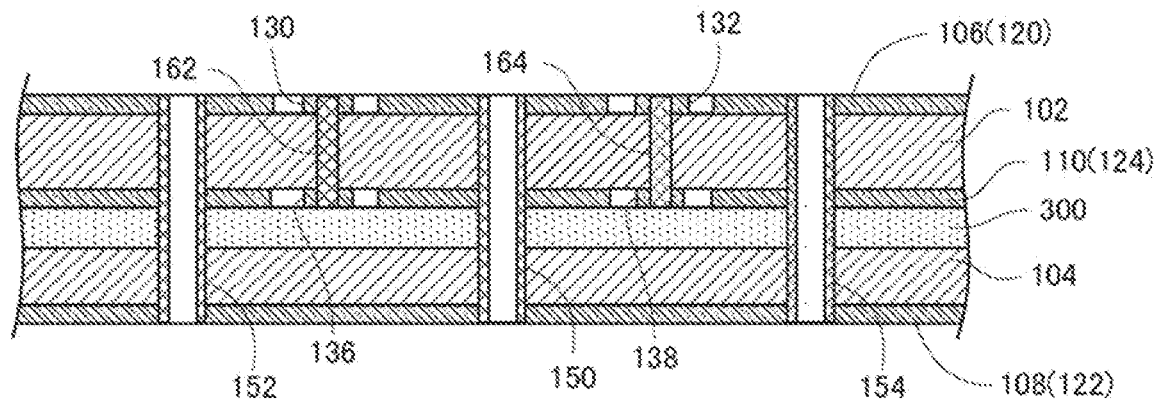
FIG. 14 is a cross-sectional view illustrating a high frequency circuit having a six-layer structure.
Figure 15:
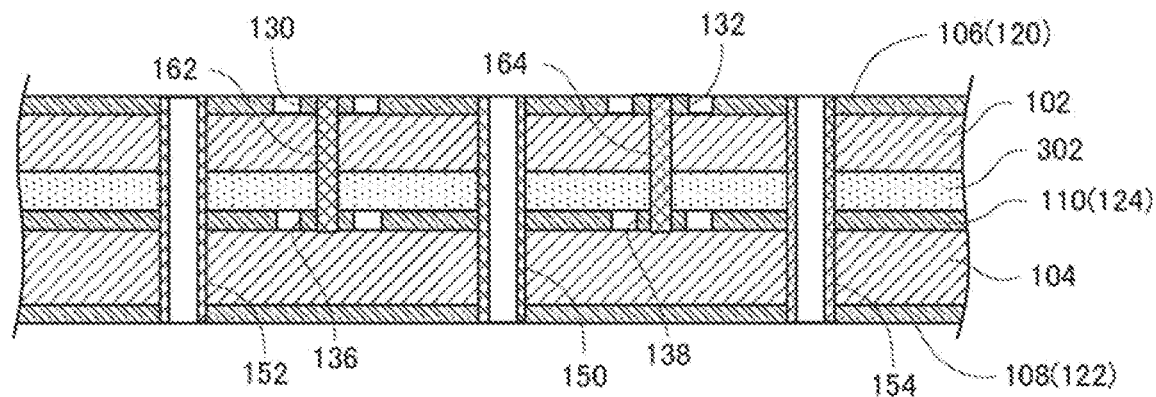
FIG. 15 is a cross-sectional view illustrating a high frequency circuit having a six-layer structure different from the six-layer structure in FIG. 14.
Figure 16:
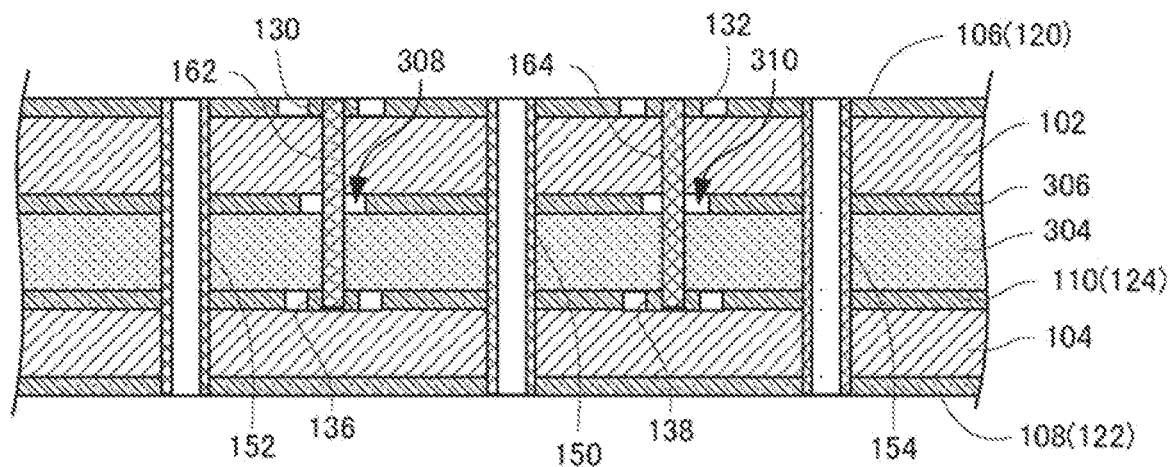
FIG. 16 is a cross-sectional view illustrating a high frequency circuit having a seven-layer structure.

In the above description, the high frequency circuit includes five layers formed of two insulating layers and three conductive layers. However, the present disclosure is not limited thereto. A circuit may include six or more layers. For example, in the five-layer structure illustrated in FIG. 5, one or more intermediate layers may be stacked between first insulating layer 102 and second insulating layer 104. The intermediate layer may be an insulating layer or a conductive layer. For example, referring to FIG. 14, in the five-layer structure illustrated in FIG. 5, insulating layer 300 made of a material different from that of second insulating layer 104 may be stacked between third conductive layer 110 and second insulating layer 104. The other material is an adhesive or the like. Referring to FIG. 15, in the five-layer structure illustrated in FIG. 5, insulating layer 302 made of a material different from that of first insulating layer 102 may be stacked between first insulating layer 102 and third conductive layer 110. Referring to FIG. 16, in the five-layer structure illustrated in FIG. 5, insulating layer 304 and conductive layer 306 may be stacked between first insulating layer 102 and third conductive layer 110. In the stacked structure illustrated in FIG. 16, isolation regions 308 and 310 are each formed so that first connection via 162 and second connection via 164 are not in contact with conductive layer 306.

Figure 17:
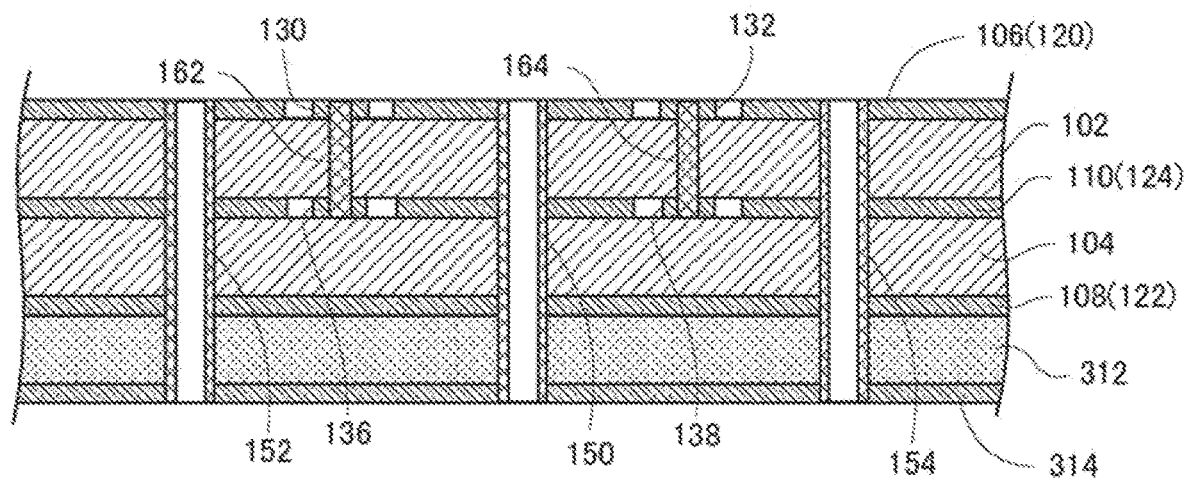
FIG. 17 is a cross-sectional view illustrating a high frequency circuit having a seven-layer structure different from the seven-layer structure in FIG. 16.

An insulating layer or an insulating layer and a conductive layer may be disposed outside the five-layer structure. For example, referring to FIG. 17, insulating layer 312 and conductive layer 314 may be stacked on second conductive layer 108 in the five-layer structure illustrated in FIG. 5. In any of the stacked structures illustrated in FIGS. 14 to 17, crosstalk between the end portions of first line 136 and second line 138 can be suppressed by first shield via 150. In addition, crosstalk with lines present on both sides of first line 136 and second line 138 can be suppressed by second shield via 152 and third shield via 154.

In the above description, the outer shape of each of the first to third shield vias, that is, long holes 140, in the XY cross section is a rounded rectangle. However, the present disclosure is not limited thereto. The outer shape of each of the first to third shield vias in the XY cross section may be any shape as long as the outer shape is inscribed in a virtual rectangle in which lengths of two sides perpendicular to each other are different from each other. For example, the outer shape may be an ellipse or a shape similar to an ellipse. Examples of the shape similar to an ellipse include a teardrop shape, a raindrop shape and the like.

Simulation results are presented below to demonstrate the effectiveness of the present disclosure.

(First Simulation)

A simulation result using the configuration and shape illustrated in FIGS. 3A to 3C and FIG. 4 is described below. Sizes used for first pad 130, second pad 132, first shield via 150, second shield via 152, third shield via 154, cylindrical shield vias 160, first line 136, second line 138, first line end portion 136E and second line end portion 138E are listed in Table 1. In Table 1, numerical values are given in a unit of mm. All shield vias were columnar. Variable names are those shown in FIGS. 3A to 3C, and FIG. 8. First pad 130, second pad 132, and isolation regions 134 were square. The center of each of first shield via 150, second shield via 152, third shield via 154, first pad 130, and second pad 132 in the XY plane had the same Y coordinate value. Each of first insulating layer 102 and second insulating layer 104 had a thickness of 0.1 mm and a relative dielectric constant of 2.2.

TABLE 1

| Variable name | L1 | L2 | L3 | L4 | L5 | L6 | L7 | L8 |
|---|---|---|---|---|---|---|---|---|
| Value | 0.15 | 0.375 | 0.14 | 0.15 | 0.34 | 0.35 | 0.7 | 0.2 |
| Variable name | D1 | D2 | P1 | P2 | P3 | W1 | W2 | |
| Value | 0.2 | 0.1 | 0.8 | 0.3 | 0.4 | 0.1 | 0.161 | |

Figure 18:
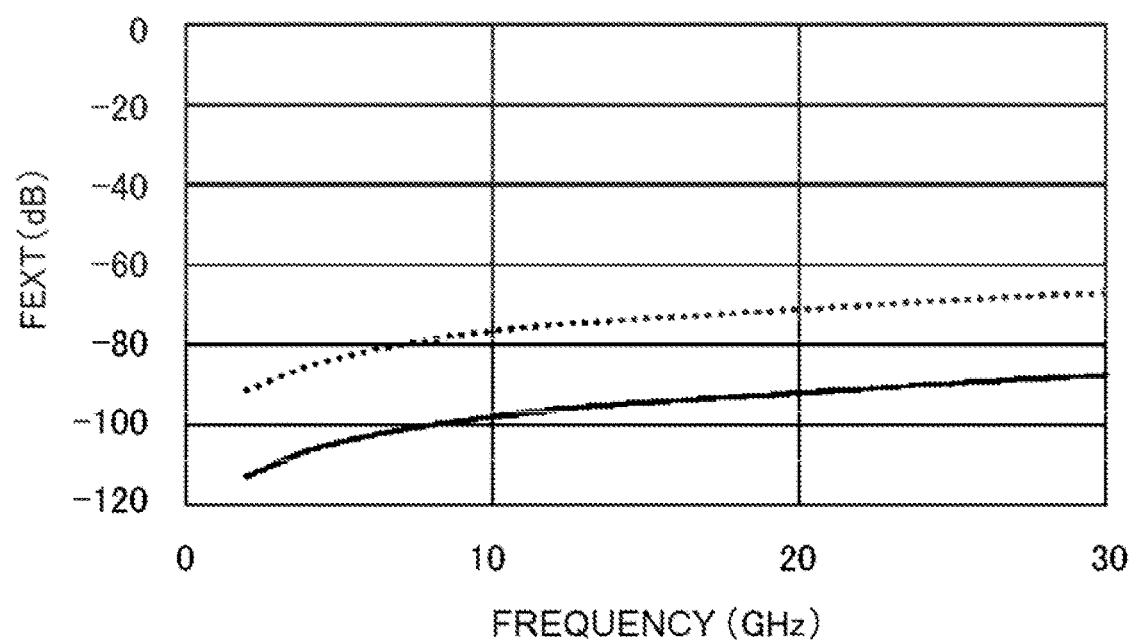
FIG. 18 is a graph illustrating a result of a first simulation.

The frequency of a high frequency signal supplied from first connector 200 illustrated in FIG. 2 to first line 136 was varied, and a signal flowing through second line 138 was numerically calculated for the substrate having the above configuration. For comparison, conditions that L7=0.2 (mm), values in Table 1 were used for other variable values, and all shield vias were columnar were set to numerically calculate a signal flowing through second line 138 in a similar manner The calculation result is illustrated in FIG. 18. A vertical axis is a FEXT value, and represents a value of a signal strength of second line 138 relative to a signal strength supplied to first line 136, that is, a ratio of a voltage amplitude in dB units. The FEXT value represents a degree of crosstalk in which a high frequency signal input to first line 136 from first connector 200 illustrated in FIG. 2 is output from second line 138. A horizontal axis represents a frequency of a supplied alternating-current signal, and the unit of the horizontal axis is GHz. The solid line indicates the result obtained by using the values in Table 1, and the dotted line indicates the result of the comparative example in which L7=0.2 (mm). From the graph of FIG. 18, it can be seen that disposing a shield via whose cross section parallel to the substrate has an elongated shape, for example, a rounded rectangular shape, in the vicinity of the line end portion, allows crosstalk to be suppressed by about 20 dB and reduced to 1/100 in terms of power intensity, as compared with a case where a shield via whose cross section is circular is disposed.

(Second Simulation)

Similarly to the first simulation, using the configuration illustrated in FIGS. 3A to 3C and FIG. 4, the value of length L7 of first shield via 150, second shield via 152, and third shield via 154 is changed to evaluate crosstalk. All shield vias were columnar. The values in Table 1 were used for the other variable values. The frequency of an alternating-current signal supplied from first connector 200 to first line 136 was varied, and a signal flowing through second line 138 was calculated numerically.

Figure 19:
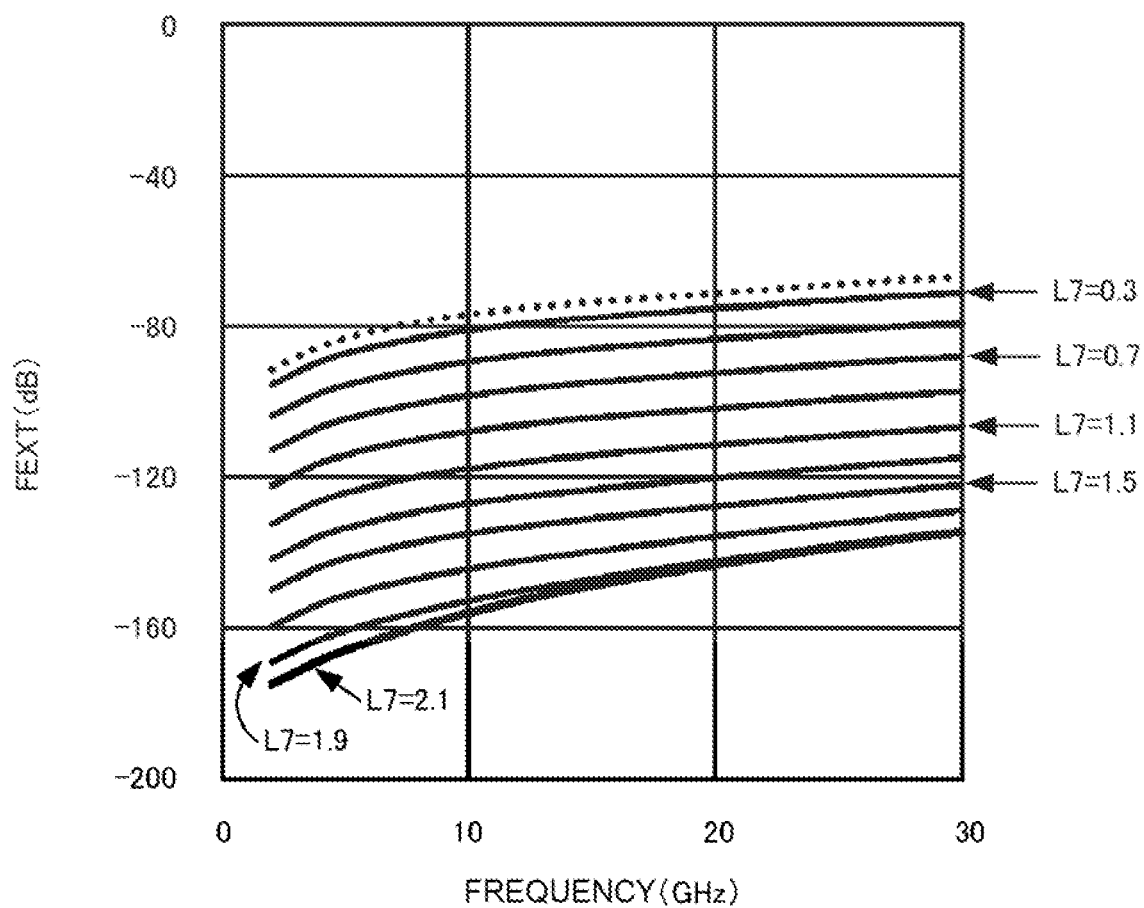
FIG. 19 is a graph illustrating a result of a second simulation.
Figure 20:
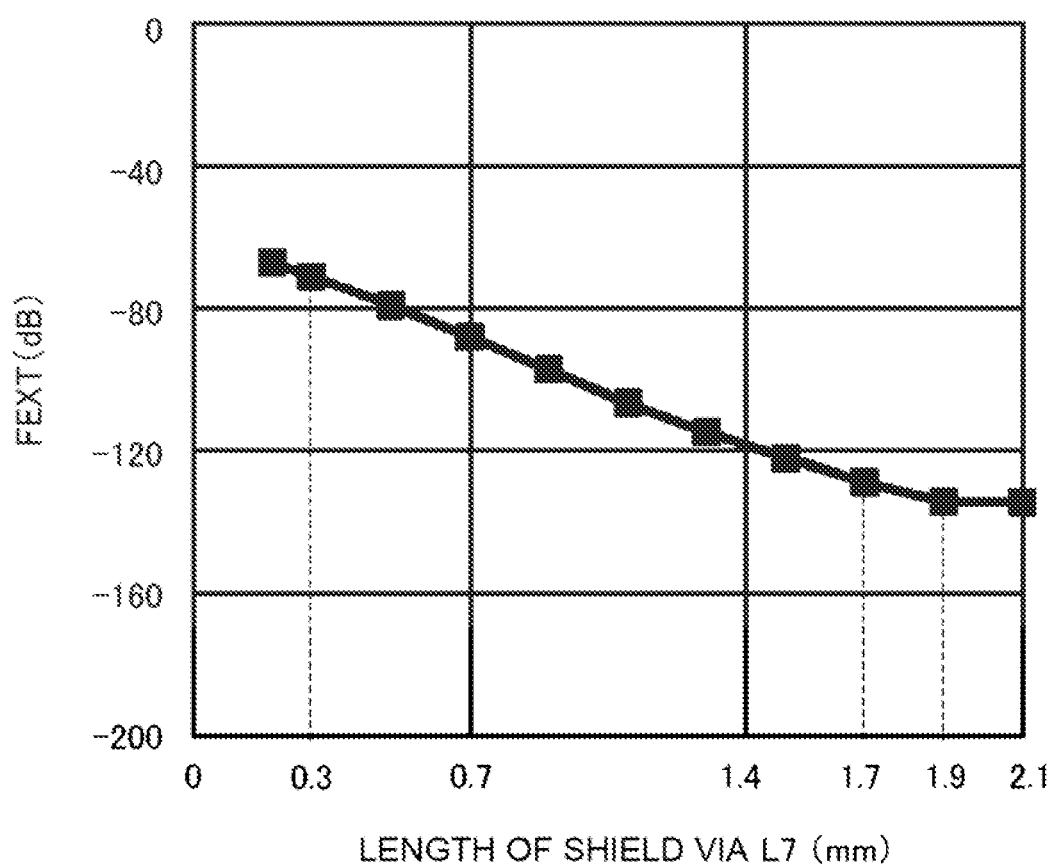
FIG. 20 is a graph illustrating a result of a second simulation.

In FIG. 19, the solid line represents a result of calculation in which length L7 is changed from 0.3 mm to 2.1 mm at intervals of 0.2 mm. The meanings of a vertical axis and a horizontal axis are the same as in FIG. 18. For reference, the dotted line graph illustrated in FIG. 18 is also illustrated by dotted line in FIG. 19. It can be seen from the graph of FIG. 19 that longer length L7 of the shield via provided in a vicinity of the line end portion is, the larger the crosstalk suppression effect is. On the other hand, the graphs of L7=1.9 and L7=2.1 are substantially the same at frequencies equal to or higher than about 15 GHz. FIG. 20 is a plot of FEXT value at 30 GHz in FIG. 19 versus length L7 of shield via. In FIG. 20, even when length L7 of shield via is increased to a certain extent or more, a decrease of FEXT value is not observed. Therefore, it is understood that length L7 of shield via may be limited to a predetermined value depending on the frequency of a signal to be transmitted.

(Third Simulation)

Figure 21:
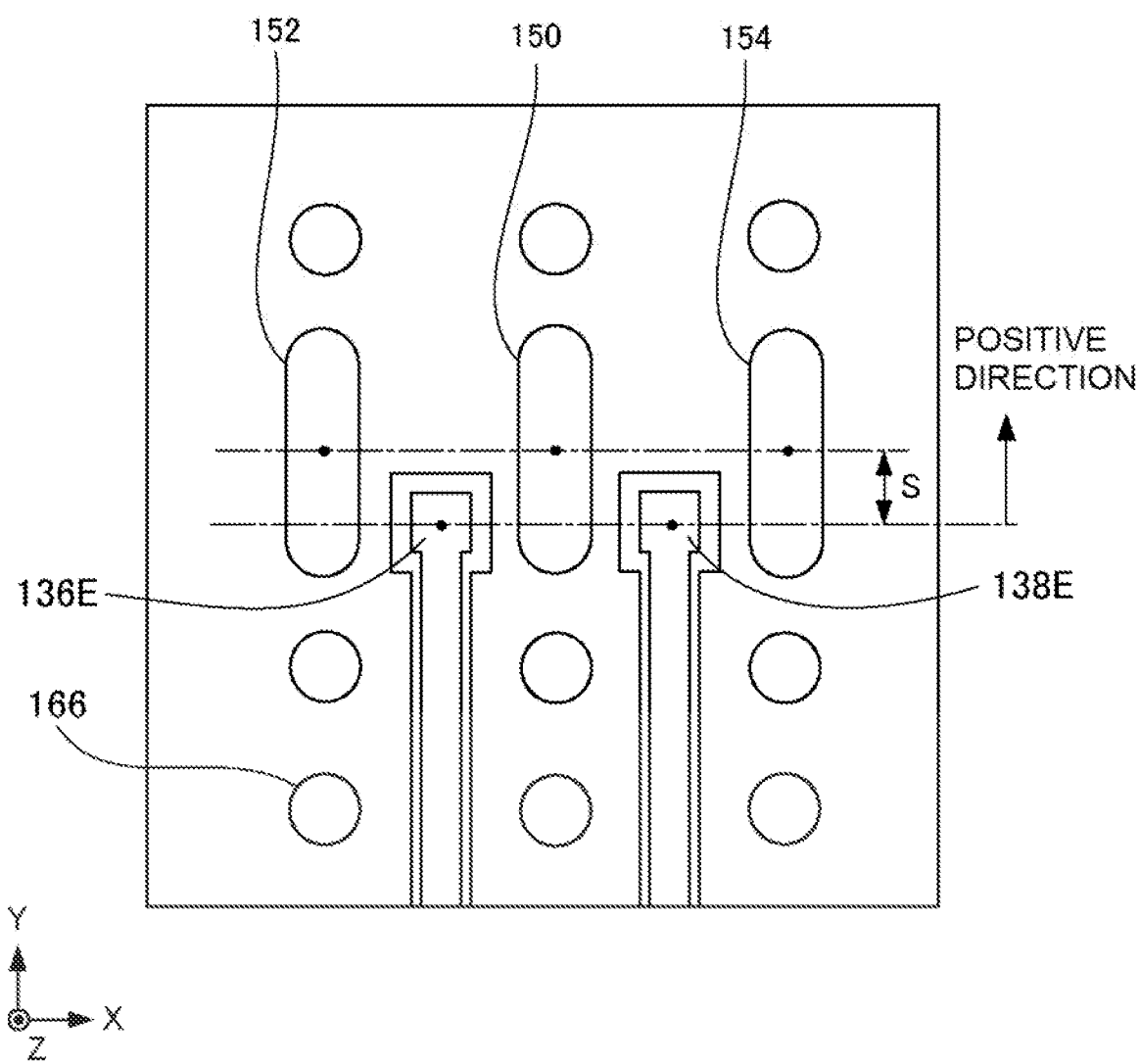
FIG. 21 is a plan view illustrating conditions of an elongated shield via for a third simulation.
Figure 22:
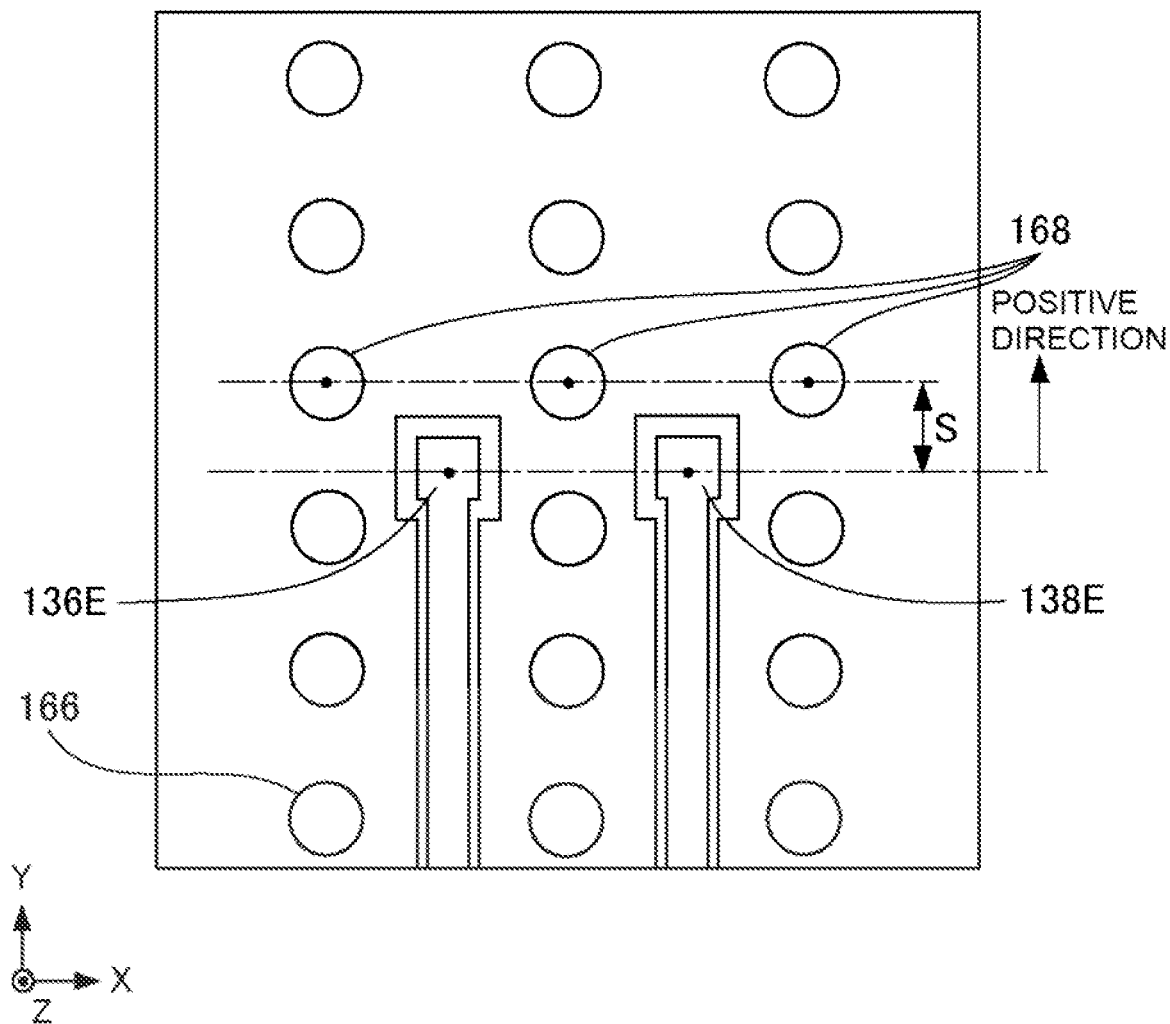
FIG. 22 is a plan view illustrating conditions of a columnar shield via for a third simulation.

The configuration illustrated in FIGS. 3A to 3C and FIG. 4 and the values listed in Table 1 are used, and the positions of first shield via 150, second shield via 152, and third shield via 154 were shifted from first pad 130 and second pad 132, respectively to evaluate crosstalk in a manner similar to the first simulation. Specifically, as illustrated in FIG. 21, the center of each of first shield via 150, second shield via 152, and third shield via 154 was shifted by a shift amount of S (mm) in the Y-axis direction with respect to the respective centers of first line end portion 136E and second line end portion 138E to perform a numerical calculation. According to the shift of first shield via 150, second shield via 152, and third shield via 154, the positions of columnar shield vias 166 were also shifted. S (mm) was varied in the range of −0.25≤S≤0.25. A shift amount in a positive direction of the Y-axis is represented by a positive value, and a shift amount in a negative direction of the Y-axis is represented by a negative value. For comparison, as illustrated in FIG. 22, a condition that L7=0.2 (mm), that is, all of the first to third shield vias were columnar was set, and the center of each of columnar shield vias 168 was shifted by a shift amount of S (mm) in a manner similar to described above to perform a numerical calculation.

Figure 23:
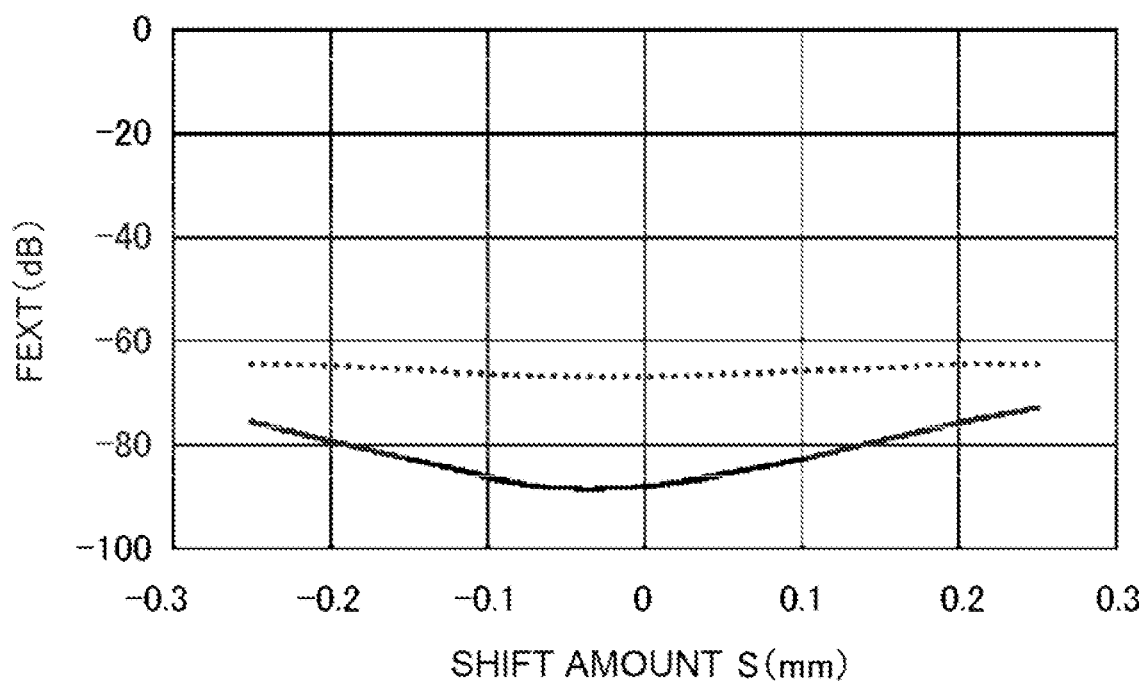
FIG. 23 is a graph illustrating a result of a third simulation.

FIG. 23 illustrates a calculation result when the frequency of the supplied alternating-current signal is set to 30 GHz. The solid line indicates the calculation result of the configuration illustrated in FIG. 21, and the dotted line indicates the calculation result of the configuration illustrated in FIG. 22. A vertical axis is a FEXT value as in FIG. 18. A horizontal axis is a shift amount of S (mm). As can be seen from FIG. 23, even when the positions of first shield via 150, second shield via 152, and third shield via 154 are shifted from first line end portion 136E and second line end portion 138E, crosstalk can be suppressed by about 10 dB or more as compared with a case where columnar shield vias 168 are used. Even when first shield via 150, second shield via 152, and third shield via 154 are shifted to a maximum, that is, S=±0.25, first shield via 150 is located between first line end portion 136E and second line end portion 138E. In addition, second shield via 152 and third shield via 154 are located on both sides of first line end portion 136E and second line end portion 138E. That is, orthogonal projections of first line end portion 136E and second line end portion 138E onto a projection plane perpendicular to a line connecting centers of first line end portion 136E and second line end portion 138E is included in orthogonal projections of first shield via 150, second shield via 152, and third shield via 154 onto the projection plane. When first line end portion 136E and second line end portion 138E are in such a positional relationship with first shield vias 150, second shield vias 152, and third shield vias 154, crosstalk to adjacent lines between signal supply paths can be sufficiently suppressed. Therefore, even when the positions of first shield via 150, second shield via 152, and third shield via 154 are slightly shifted from design positions, crosstalk can be sufficiently suppressed, so that the influence of the manufacturing accuracy on the suppression effect of the crosstalk can be reduced.

The minimum value of the solid line graph illustrated in FIG. 23 is not at the point of S=0, but is shifted to the negative side of shift amount S from the point. This is considered to be because first line 136 and second line 138 extend to the negative side of the Y-axis. Therefore, it is most preferable that the center of each of first shield via 150, second shield via 152, and third shield via 154 is slightly shifted from the center of each of first line end portion 136E and second line end portion 138E in the negative direction of the Y-axis in which the lines extend.

(Fourth Simulation)

Figure 24:
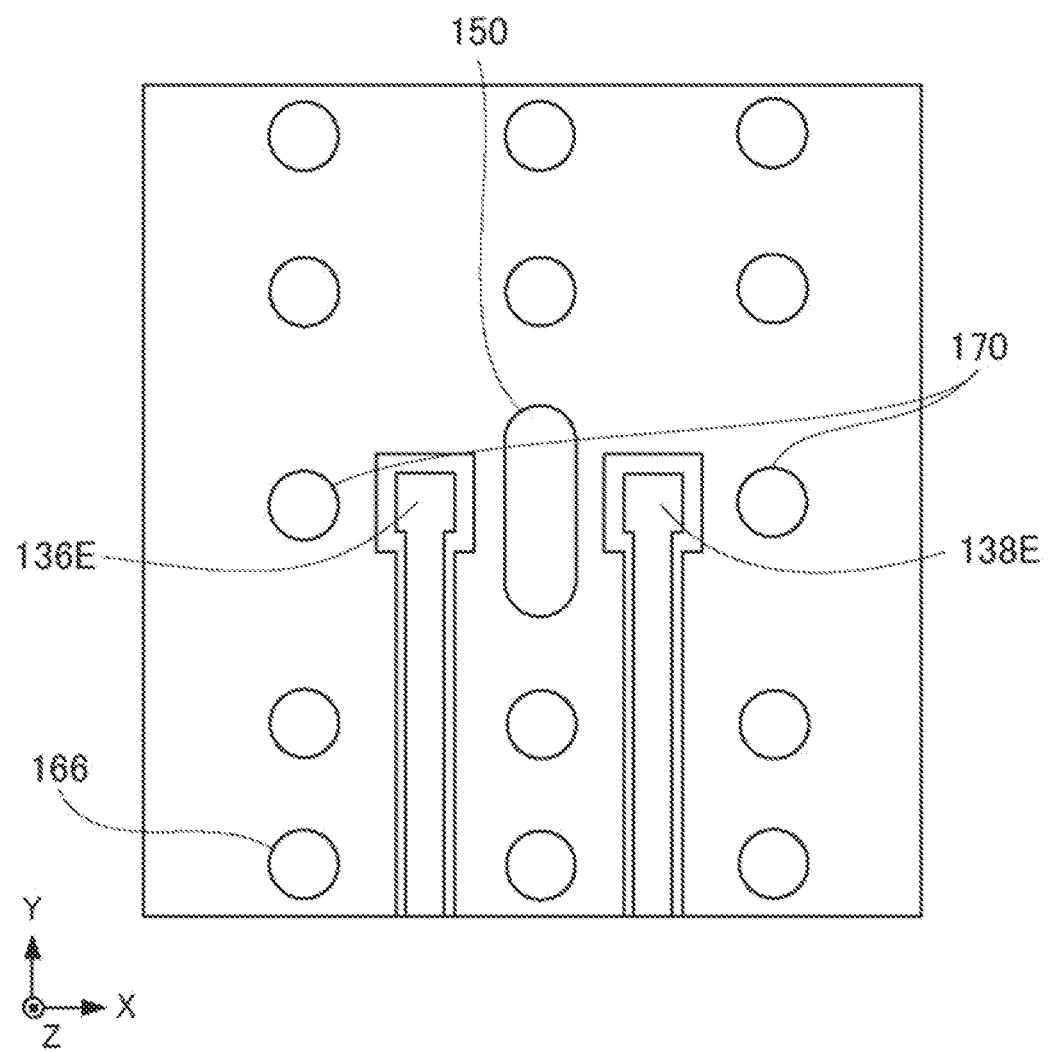
FIG. 24 is a plan view illustrating conditions of a fourth simulation.

A simulation was performed to confirm the effect of a shield via disposed between end portions of lines. Specifically, as illustrated in FIG. 24, in the configuration illustrated in FIGS. 3A to 3C and FIG. 4, second shield via 152 and third shield via 154 illustrated in FIG. 21 are replaced with columnar shield vias 170 having the same sizes as columnar shield vias 166. The values listed in Table 1 were used for each variable value. Under such conditions, as in the first simulation, the frequency of a high frequency signal supplied from first connector 200 to first line 136 was varied, and a signal flowing through second line 138 was calculated numerically.

Figure 25:
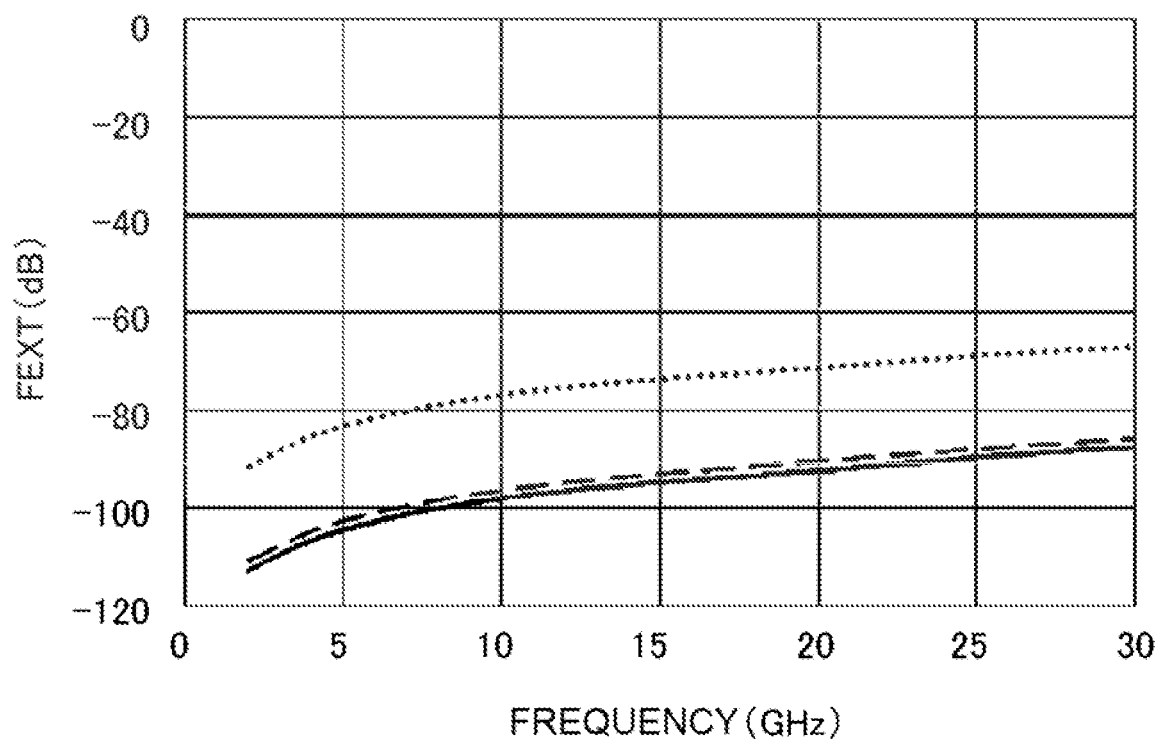
FIG. 25 is a graph illustrating a result of a fourth simulation.

The calculation result is indicated by dashed line in FIG. 25. For reference, the dotted line illustrated in FIG. 18 and the solid line with L7=0.7 are also shown in FIG. 25. In FIG. 25, FEXT values of the dashed line are slightly greater than FEXT values of the solid line, but are sufficiently smaller than FEXT values of the dotted line. Therefore, when only the shield via provided between first line end portion 136E and second line end portion 138E has an XY cross section of an elongated shape such as a rounded rectangle, a sufficient effect of suppressing crosstalk between the signal supply paths to first line 136 and second line 138 can be obtained.

The present disclosure has been described above by describing the embodiments. However, the embodiments described above are merely illustrative, and the present disclosure is not limited to the embodiments described above. The scope of the present disclosure is defined by each claim in the appended claims, in consideration of the detailed description of the invention, and embraces all the modifications within the meaning and scope equivalent to the terms described therein.

REFERENCE SIGNS LIST 100, 220, 222, 224, 226, 900 high frequency circuit
102 first insulating layer
104 second insulating layer
106 first conductive layer
108 second conductive layer
110 third conductive layer
112 via
120 first ground
122 second ground
124 third ground
130 first pad
132 second pad
134, 144, 234, 244, 308, 310 isolation region
136 first line
138 second line
136E first line end portion
138E second line end portion
140 long hole
142 circular hole
150, 150A, 250, 270, 280 first shield via
152, 252, 272, 282 second shield via
154, 254, 274, 284 third shield via
160, 276, 278, 286 cylindrical shield via
162 first connection via
164 second connection via
166, 168, 170 columnar shield via
200 first connector
202 second connector
204 central conductor
206 outer conductor
230 first pad pair
230A, 230B, 232A, 232B pad
232 second pad pair
236 first line pair
236A, 236B, 238A, 238B line
236EA, 236EB, 238EA, 238EB end portion
238 second line pair
262 first connection via pair
262A, 262B, 264A, 264B connection via
264 second connection via pair
300, 302, 304, 312 insulating layer
306, 314 conductive layer
902 signal transmission path
904 shield via
D1, D2 diameter
L1, L2, L3, L4, L5, L6, L7, L8 length
P1, P2, P3 interval
S shift amount
W1, W2 width
θ angle

The invention claimed is:

1. A high frequency circuit comprising:
a first insulating layer;
a second insulating layer stacked on the first insulating layer directly or with one or more intermediate layers interposed therebetween;
a first ground disposed on a first surface of the first insulating layer, the first surface and a second surface forming two surfaces of the first insulating layer, the first surface being a surface that does not face the second insulating layer;
a first line and a second line disposed between the first insulating layer and the second insulating layer, the first line having a first end portion to which a first alternating-current signal is to be supplied, the second line having a second end portion to which a second alternating-current signal is to be supplied;
a second ground disposed on a third surface of the second insulating layer, the third surface and a fourth surface forming two surfaces of the second insulating layer, the third surface being a surface that does not face the first insulating layer; and a first shield via that is conductive, the first shield via being located between the first end portion and the second end portion, the first end portion and the second end portion being isolated from each other in a direction along the fourth surface, the first shield via extending through the first insulating layer and the second insulating layer and being connected to the first ground and the second ground, wherein a cross section of the first shield via parallel to the second surface is inscribed in a first virtual rectangle having a long side and a short side perpendicular to the long side.

2. The high frequency circuit according to claim 1, wherein in one plane parallel to the second surface, the long side of the first rectangle and a straight line connecting the first end portion and the second end portion define an acute angle of 45 degrees or more.

3. The high frequency circuit according to claim 1, wherein the first insulating layer has an opening from which the first end portion and the second end portion are exposed.

4. The high frequency circuit according to claim 1, further comprising:
   a first pad and a second pad that are conductive, the first pad and the second pad being disposed on the first surface so as to be isolated from the first ground;
   a first connection via that is conductive, the first connection via extending through the first insulating layer and connecting the first pad and the first end portion; and
   a second connection via that is conductive, the second connection via extending through the first insulating layer and connecting the second pad and the second end portion.

5. The high frequency circuit according to claim 1, further comprising
   a second shield via that is conductive, the second shield via extending through an insulating layer through which the first shield via extends among the first insulating layer and the second insulating layer, the second shield via being connected to a ground to which the first shield via is connected among the first ground and the second ground, the second shield via facing the first shield via with the first end portion interposed therebetween, wherein
   a cross section of the second shield via parallel to the second surface is inscribed in a second virtual rectangle including two perpendicular sides of different lengths.

6. The high frequency circuit according to claim 5, further comprising
   a third shield via that is conductive, the third shield via extending through the insulating layer through which the first shield via extends and being connected to the ground, the third shield via facing the first shield via with the second end portion interposed therebetween, wherein
   a cross section of the third shield via parallel to the second surface is inscribed in a third virtual rectangle including two perpendicular sides of different lengths.

7. The high frequency circuit according to claim 1, further comprising
   a third line disposed on the second surface on a side opposite to a side of the first line on which the first shield via is located, the third line having a third end portion to which a third alternating-current signal is to be supplied, wherein
   the first alternating-current signal and the third alternating-current signal are differential signals.

8. The high frequency circuit according to claim 7, further comprising
   a fourth line disposed on the second surface on a side opposite to a side of the second line on which the first shield via is located, the fourth line having a fourth end portion to which a fourth alternating-current signal is to be supplied, wherein
   the second alternating-current signal and the fourth alternating-current signal are differential signals.

9. The high frequency circuit according to claim 1, wherein the first shield via is disposed so as to include a center between the first end portion and the second end portion.

10. The high frequency circuit according to claim 1, wherein a center of the first rectangle is located closer to a side where the first line and the second line are present than a center between the first end portion and the second end portion.

11. The high frequency circuit according to claim 1, wherein the long side of the first rectangle has a length 1.5 times or more a length of the short side of the first rectangle.

12. The high frequency circuit according to claim 1, wherein the long side of the first rectangle has a length ½ or more a distance between the first end portion and the second end portion.

13. A high frequency circuit comprising:
    a first insulating layer;
    a second insulating layer stacked on the first insulating layer directly or with one or more intermediate layers interposed therebetween;
    a first ground disposed on a first surface of the first insulating layer, the first surface and a second surface forming two surfaces of the first insulating layer, the first surface being a surface that does not face the second insulating layer;
    a first line and a second line disposed between the first insulating layer and the second insulating layer, the first line having a first end portion to which a first alternating-current signal is to be supplied, the second line having a second end portion to which a second alternating-current signal is to be supplied;
    a second ground disposed on a third surface of the second insulating layer, the third surface and a fourth surface forming two surfaces of the second insulating layer, the third surface being a surface that does not face the first insulating layer;
    a third ground disposed between the first insulating layer and the second insulating layer; and
    a first shield via that is conductive, the first shield via being located between the first end portion and the second end portion, the first end portion and the second end portion being isolated from each other in a direction along the fourth surface, the first shield via extending through at least one insulating layer among the first insulating layer and the second insulating layer and being connected to the third ground and a ground located on a side on which the at least one insulating layer is located with respect to the first end portion and the second end portion among the first ground and the second ground, wherein
    a cross section of the first shield via parallel to the second surface is inscribed in a first virtual rectangle having a long side and a short side perpendicular to the long side.

14. The high frequency circuit according to claim 13, wherein in one plane parallel to the second surface, the long side of the first rectangle and a straight line connecting the first end portion and the second end portion define an acute angle of 45 degrees or more.

15. The high frequency circuit according to claim 13, wherein the first insulating layer has an opening from which the first end portion and the second end portion are exposed.

16. The high frequency circuit according to claim 13, further comprising:
   a first pad and a second pad that are conductive, the first pad and the second pad being disposed on the first surface so as to be isolated from the first ground;
   a first connection via that is conductive, the first connection via extending through the first insulating layer and connecting the first pad and the first end portion; and
   a second connection via that is conductive, the second connection via extending through the first insulating layer and connecting the second pad and the second end portion.

17. The high frequency circuit according to claim 13, further comprising
   a second shield via that is conductive, the second shield via extending through an insulating layer through which the first shield via extends among the first insulating layer and the second insulating layer, the second shield via being connected to a ground to which the first shield via is connected among the first ground and the second ground, the second shield via facing the first shield via with the first end portion interposed therebetween, wherein
   a cross section of the second shield via parallel to the second surface is inscribed in a second virtual rectangle including two perpendicular sides of different lengths.

18. The high frequency circuit according to claim 17, further comprising
   a third shield via that is conductive, the third shield via extending through the insulating layer through which the first shield via extends and being connected to the ground, the third shield via facing the first shield via with the second end portion interposed therebetween, wherein
   a cross section of the third shield via parallel to the second surface is inscribed in a third virtual rectangle including two perpendicular sides of different lengths.

19. The high frequency circuit according to claim 13, further comprising
   a third line disposed on the second surface on a side opposite to a side of the first line on which the first shield via is located, the third line having a third end portion to which a third alternating-current signal is to be supplied, wherein
   the first alternating-current signal and the third alternating-current signal are differential signals.

20. The high frequency circuit according to claim 19, further comprising
   a fourth line disposed on the second surface on a side opposite to a side of the second line on which the first shield via is located, the fourth line having a fourth end portion to which a fourth alternating-current signal is to be supplied, wherein
   the second alternating-current signal and the fourth alternating-current signal are differential signals.

* * * * *